(12) United States Patent
Saeki

(10) Patent No.: US 7,614,301 B2
(45) Date of Patent: *__Nov. 10, 2009__

(54) ACCELERATION SENSOR CHIP PACKAGE AND METHOD OF PRODUCING THE SAME

(75) Inventor: Yoshihiro Saeki, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/907,877

(22) Filed: Oct. 18, 2007

(65) Prior Publication Data

US 2008/0047345 A1 Feb. 28, 2008

Related U.S. Application Data

(63) Continuation of application No. 11/238,014, filed on Sep. 29, 2005, now Pat. No. 7,299,696.

(30) Foreign Application Priority Data

Oct. 14, 2004 (JP) ............................. 2004-299568

(51) Int. Cl.
*G01P 15/08* (2006.01)

(52) U.S. Cl. ............... 73/514.33; 73/514.01; 73/514.38

(58) Field of Classification Search ............... 73/514.33, 73/514.01, 514.38
See application file for complete search history.

(56) References Cited

U.S. PATENT DOCUMENTS

| 5,490,421 | A  | * | 2/1996  | Ueyanagi ................. 73/514.33 |
| 6,263,735 | B1 |   | 7/2001  | Nakatani et al. |
| 6,293,149 | B1 |   | 9/2001  | Yoshida et al. |
| 6,316,840 | B1 | * | 11/2001 | Otani ......................... 257/787 |
| 7,267,007 | B2 | * | 9/2007  | Nakamura ............... 73/514.33 |

FOREIGN PATENT DOCUMENTS

JP          11-135804          5/1999

* cited by examiner

*Primary Examiner*—John E Chapman
(74) *Attorney, Agent, or Firm*—Kubotera & Associates, LLC

(57) ABSTRACT

An acceleration sensor chip package includes an acceleration sensor chip formed of a frame portion with an opening portion, a movable structure, a detection element, and an electrode pad. The movable structure has a beam portion and a movable portion supported on the beam portion to be movable. The acceleration sensor chip package further includes a re-wiring layer with a wiring portion having one end connected to the electrode pad; an outer terminal connected to the other end of the wiring portion; a first sealing portion for sealing the electrode pad and the re-wiring layer; and a substrate for sealing the opening portion of the frame portion.

19 Claims, 17 Drawing Sheets

Fig. 7(A)
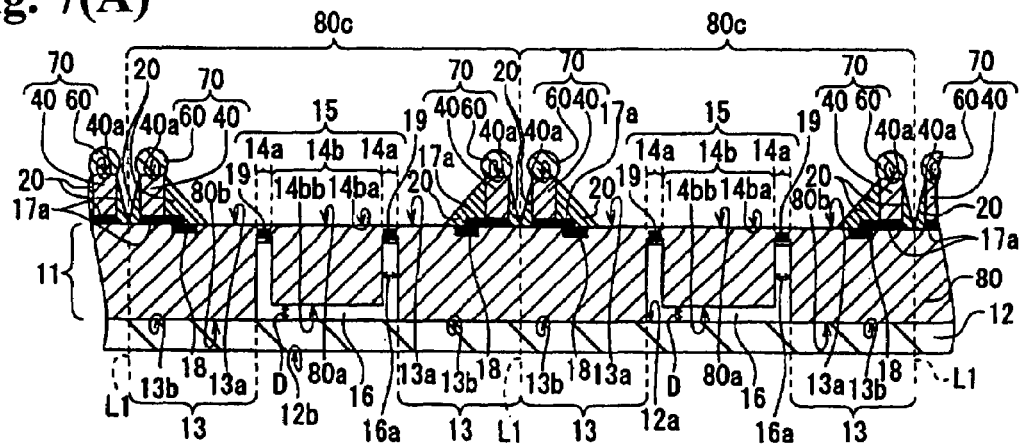
Fig. 7(B)
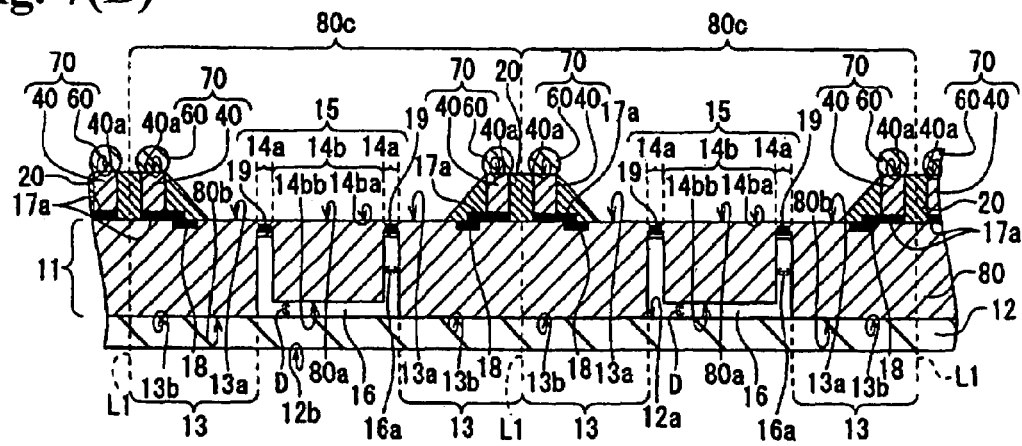
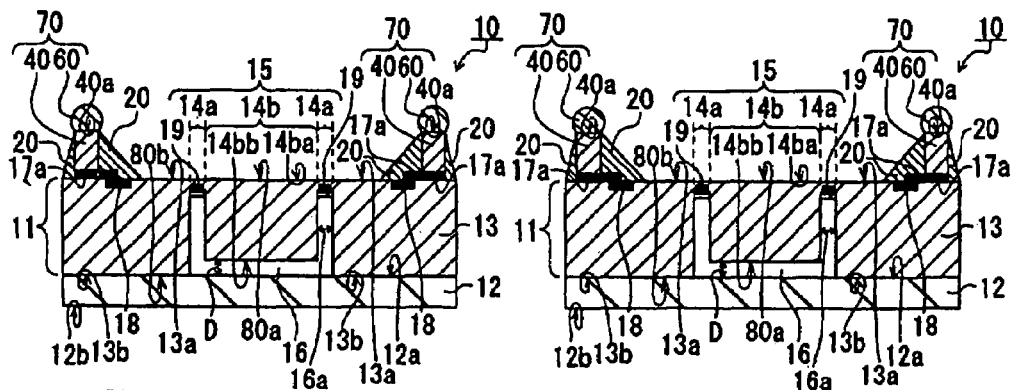
Fig. 7(C)

ACCELERATION SENSOR CHIP PACKAGE AND METHOD OF PRODUCING THE SAME

CROSS-REFERENCE TO RELATED APPLICATIONS

This is a continuation application of the prior application Ser. No. 11/238,014, filed on Sep. 29, 2005 now U.S. Pat. No. 7,299,696, allowed. The disclosure of Japanese Patent Application No. 2004-299568, filed on Oct. 14, 2004, is incorporated in the application by reference.

BACKGROUND OF THE INVENTION AND RELATED ART STATEMENT

The present invention relates to an acceleration sensor chip package and a method of producing the same.

Recently, technology for producing a microstructure having a size of a few hundred microns has been advanced using micromachining technology based on semiconductor manufacturing technology. The technology has been applied to various sensors, for example, photo-switches in an optical communication system, and radio frequency (RF) components. Since such a microstructure can be produced with a conventional semiconductor manufacturing process, it is possible to mount a large number of microstructures on a single chip.

Such a chip formed of the microstructures having a system with a specific function is called Micro-Electrical-Mechanical-Systems (MEMS) or Micro-System-Technology (MIST; referred to as an MEMS device hereinafter). The MEMS device includes an acceleration sensor (see Patent Reference 1).

Patent Reference 1: Japanese Patent Publication No. 11-135804

In Patent Reference 1, the acceleration sensor is a piezo-type, and has a frame portion formed of a center portion and a beam portion. The beam portion extends at least between a portion of an inner circumferential side surface of the frame portion and the center portion. A weight portion (movable portion) is supported on the center portion to be freely rotatable. A supporting portion is provided for supporting a lower surface of the frame portion, and surrounds an outer circumferential edge of the weight portion through a cut portion thereof. The movable portion moves upon receiving an external force, and is integrated with the frame portion to form a microstructure. The frame portion has a small thickness and a small width. Such a sensor chip is generally formed as a packaged device.

With reference to FIGS. 17(A) and 17(B), a conventional acceleration sensor chip package will be explained. FIG. 17(A) is a schematic plan view showing the conventional acceleration sensor chip package viewed from an upper surface side for explaining constituents. An upper surface of a protection cover (described later) is omitted to provide a transparent view for showing an internal configuration. FIG. 17(B) is a schematic sectional view taken along a projected line 17(B)-17(B) in FIG. 17(A).

As shown in FIG. 17(A), a conventional acceleration sensor chip package 100 is provided with an acceleration sensor chip 110. The acceleration sensor chip 110 is provided with electrode pads 112 for outputting a signal from the acceleration sensor chip 110 or inputting a signal to the acceleration sensor chip 110. The acceleration sensor chip 110 is also provided with a movable structure 114 operating mechanically, and a sealing substrate 116 for sealing the movable structure 114 to regulate a movement thereof. As shown in FIG. 17(B), the sealing substrate 116 is attached to a substrate 120 with an adhesive 122.

An edge of an opening of the protection cover 130 is attached to the substrate 120, so that the protection cover 130 forms a closed space 140 for sealing the acceleration sensor chip 110. Outer terminals 150 are disposed at an edge of the substrate 120, and extend outwardly from inside the closed space 140 formed by the protection cover 130. In the closed space 140, the outer terminals 150 are electrically connected to the electrode pads 120 of the acceleration sensor chip 110 through bonding wires 160.

In the conventional acceleration sensor chip package described above, the acceleration sensor chip is electrically connected to the outer terminals through the bonding wires. The protection cover is provided for sealing the acceleration sensor chip while retaining the bonding wires. Accordingly, it is difficult to seal the acceleration sensor chip through transfer molding or potting using a liquid resin, thereby increasing a size of the acceleration sensor chip package.

Further, when the conventional acceleration sensor chip package is produced, the acceleration sensor chip is packaged after dicing. Accordingly, a cut waste may stick to an area around the movable portion (weight) upon dicing, so that the movable portion may be damaged and not operate properly.

In view of the problems described above, an object of the present invention is to provide technology for producing an acceleration sensor chip package having a small size. Further, an object of the present invention is to provide technology capable of producing an acceleration sensor chip package in a simple process while preventing a movable portion from being damaged, thereby increasing a product yield.

Further objects and advantages of the invention will be apparent from the following description of the invention.

SUMMARY OF THE INVENTION

In order to attain the objects described above, according to the present invention, an acceleration sensor chip package includes an acceleration sensor chip. The acceleration sensor chip includes a frame portion having an upper surface and a lower surface opposite to the upper surface and including an opening portion extending from the upper surface to the lower surface; a movable structure having a beam portion extending from the frame portion toward inside the opening portion, and a movable portion disposed in the opening portion and supported on the beam portion to be movable; a detection element for detecting a movement of the movable structure; and an electrode pad electrically connected to the detection element and exposed on the upper surface of the frame.

The acceleration sensor chip further includes a re-wiring layer. The re-wiring layer has a wiring portion extending on the frame portion and having one end electrically connected to the electrode pad. The outer terminal is connected to the other end of the wiring portion and disposed on the upper surface of the frame portion.

The acceleration sensor chip package further includes a first sealing portion for sealing the electrode pad and the re-wiring layer. The first sealing portion is disposed on the acceleration sensor chip package, so that a part of the outer terminal is exposed. The first sealing portion has a closed shape or a ring shape. The acceleration sensor chip package further includes a substrate attached to a lower surface of the acceleration sensor chip for sealing the opening portion from a side of the lower surface.

According to the present invention, a method of producing an acceleration sensor chip package includes the steps of:

preparing a semiconductor substrate having a plurality of chip regions defined with scribe lines in a matrix pattern and an opening portion disposed in each of the chip regions, in which a plurality of intermediate acceleration sensors each having an electrode pad and a movable structure disposed in the opening portion is formed in the chip regions; attaching a substrate for sealing a lower surface of the movable structures; forming a re-wiring layer having a wiring portion with one end electrically connected to the electrode pad in each of the chip regions; forming an outer terminal connected to the other end of the wiring portion in each of the chip regions; forming a first sealing portion with a closed shape or a ring shape for sealing the electrode pad and the re-wiring layer in each of the chip regions so that a part of the outer terminal is exposed; and cutting the first sealing portion, the semiconductor substrate, and the substrate along the scribe lines to form the acceleration sensor chip package as a piece.

In the present invention, it is possible to make an outer size of the acceleration sensor chip package same as a size of the acceleration sensor chip, thereby greatly reducing the size of the acceleration sensor chip package. In the acceleration sensor chip package of the present invention, the outer terminal protrudes from the package. Accordingly, it is possible to protect the acceleration sensor chip package from an external force with the outer terminal during transportation in the manufacturing process and after the production.

In the method of the present invention, it is possible to efficiently produce the acceleration sensor chip package with the configuration described above.

BRIEF DESCRIPTION OF THE DRAWINGS

FIGS. 7(A) to 7(C) are schematic sectional views showing the acceleration sensor chip package during the manufacturing process continued from FIGS. 6(A) and 6(B);

DETAILED DESCRIPTION OF PREFERRED EMBODIMENTS

Figure 1A:
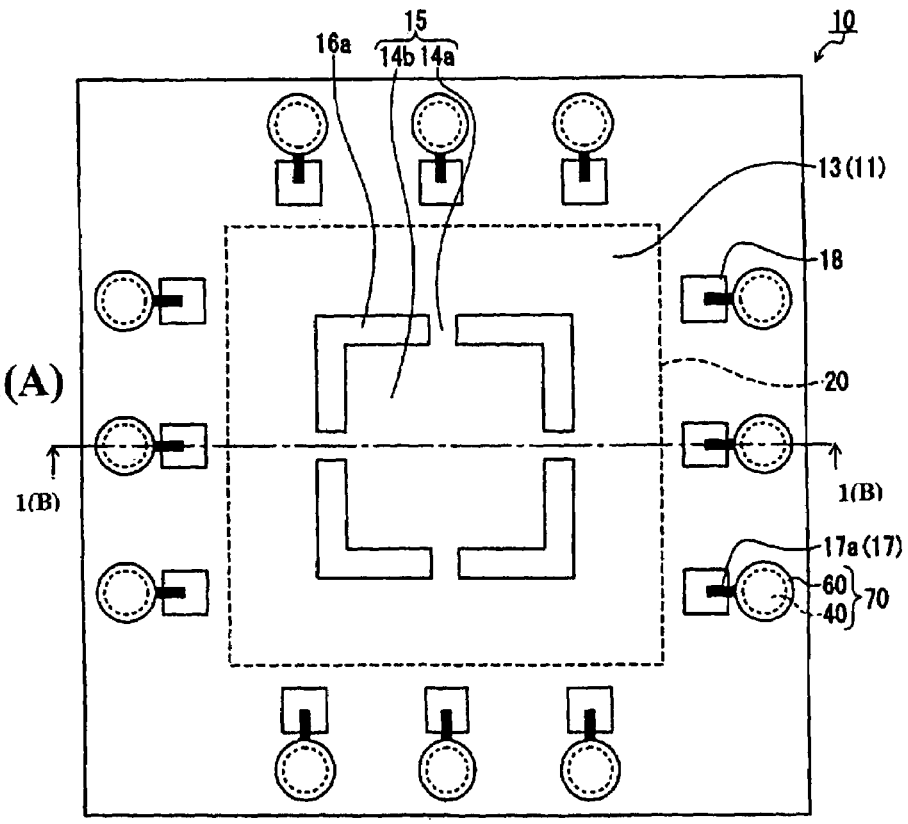
FIG. 1(A) is a schematic plan view showing an acceleration sensor chip package for explaining constituents thereof according to a first embodiment of the present invention.

Hereunder, embodiments of the present invention will be explained with reference to the accompanying drawings. The drawings schematically show shapes, sizes, and positional relationships of constituents, and the invention is not limited to those shown in the drawings. In the drawings, a size, a shape, and an arrangement of constituting components are schematically shown for explanation of the present invention. Specific materials, conditions, and numerical conditions described in the following description are just examples. In the following description, same reference numerals denote similar components, and explanations thereof may be omitted.

First Embodiment

A configuration of an acceleration sensor chip package according to a first embodiment of the present invention will be explained with reference to FIGS. 1(A), 1(B), 2(A), and 2(B). In the first embodiment, the acceleration sensor chip package includes a piezo-type acceleration sensor chip with a piezo-resistance as a functional element. The acceleration sensor chip is a semiconductor chip capable of measuring a specific acceleration. The acceleration sensor chip package is a packaged device including such an acceleration sensor chip.

Figure 1B:
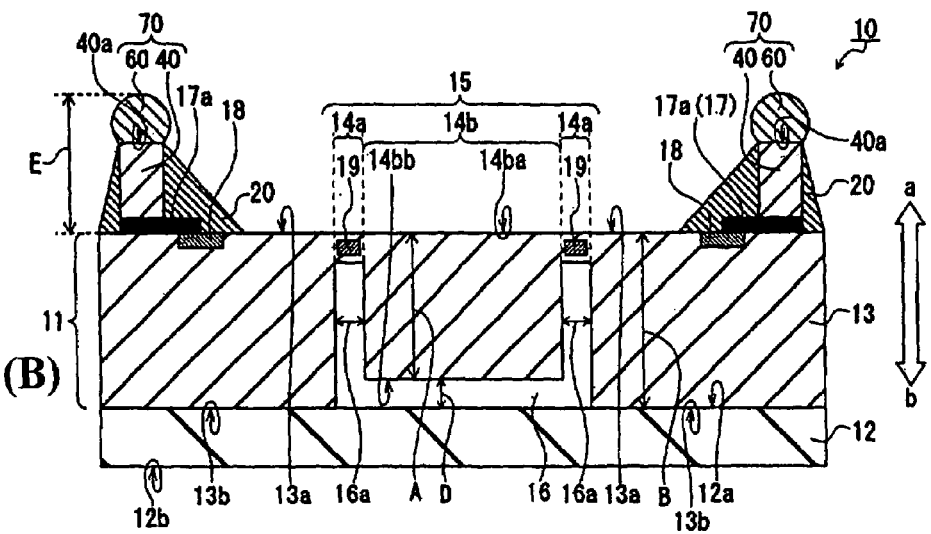
FIG. 1(B) is a sectional view taken along a projected line 1(B)-1(B) in FIG. 1(A)
Figure 2A:
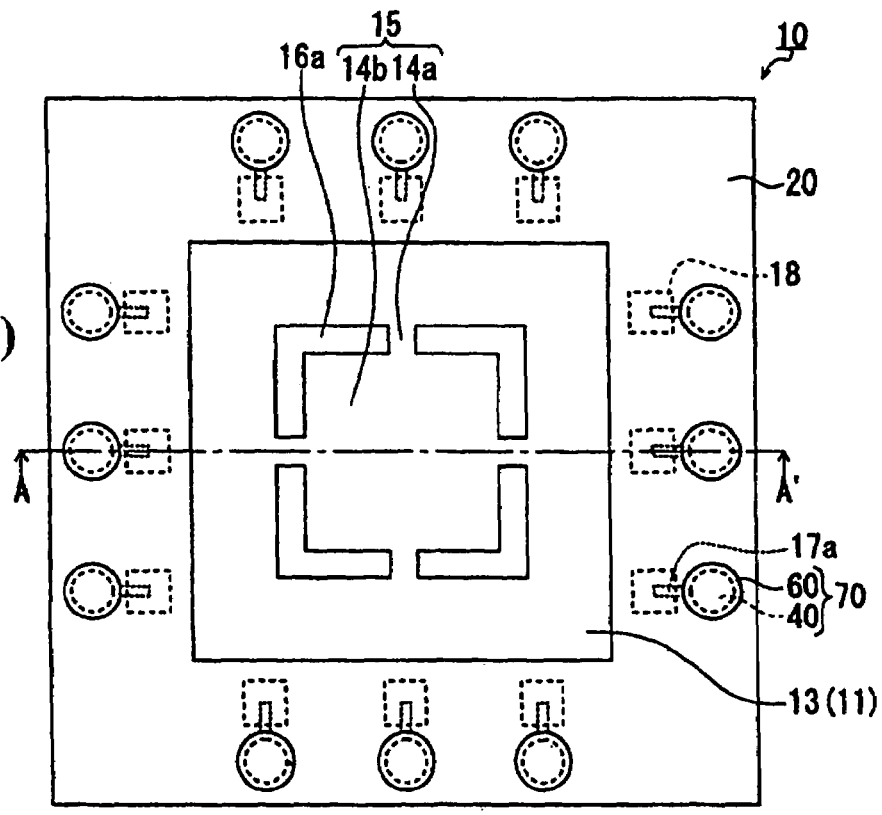
FIGS. 2(A) and 2(B) are schematic plan views of the acceleration sensor chip package for explaining constituents thereof.
Figure 2B:
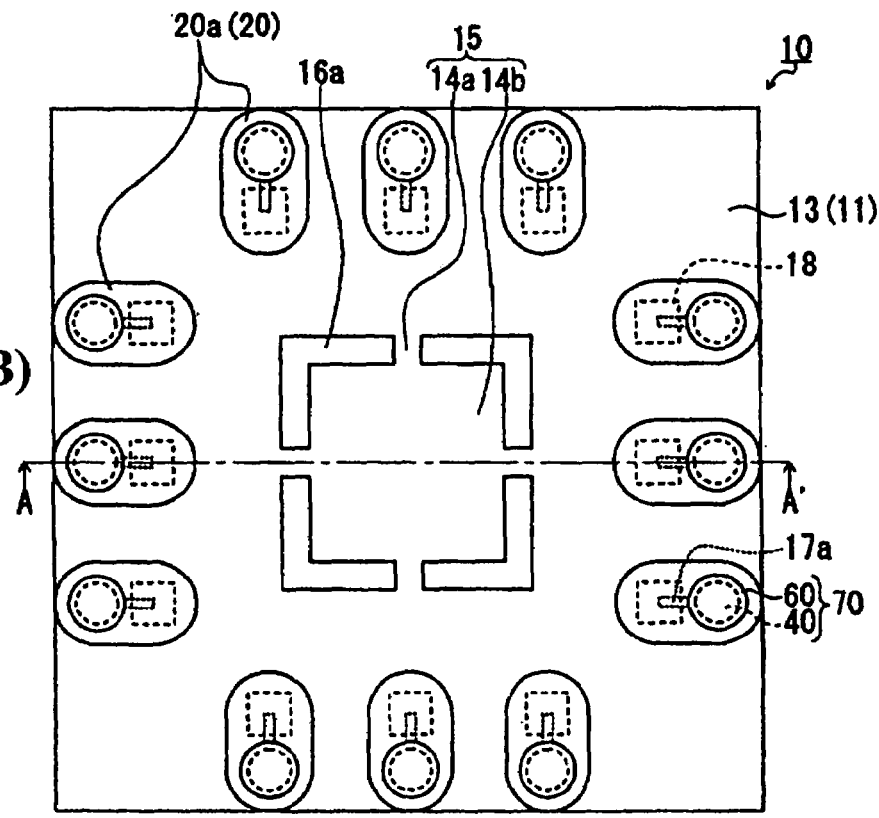

FIG. 1(A) is a schematic plan view showing the acceleration sensor chip package for explaining constituents thereof according to the first embodiment of the present invention. In FIG. 1(A), a sealing portion (described later) disposed on top of the acceleration sensor chip package is omitted for the explanation. FIG. 1(B) is a sectional view taken along a projected line 1(B)-1(B) in FIG. 1(A). FIGS. 2(A) and 2(B) are schematic plan views of the acceleration sensor chip package for explaining constituents thereof.

As shown in FIGS. 1(A) and 1(B), an acceleration sensor chip package 10 is provided with an acceleration sensor chip 11. The acceleration sensor chip 11 is provided with a frame portion 13 having an upper surface 13a and a lower surface 13b opposite to the upper surface 13a. In the embodiment, the frame portion 13 forms an outer frame with a rectangular shape defining an outer shape (contour) of the acceleration sensor chip 11.

The acceleration sensor chip 11 is provided with an opening portion 16. In the embodiment, the opening portion 16 is surrounded by the frame portion 13 with a rectangular shape, thereby forming a through hole extending from the upper surface 13a to the lower surface 13b of the frame portion 13. The acceleration sensor chip 11 is also provided with a movable structure 15 having a beam portion 14a and a movable portion 14b. The movable portion 14b is integrated with the beam portion 14a to be movable. The beam portion 14a extends from the frame portion 13 into the opening portion 16. The beam portion 14a has a small thickness and a small width, and functions as a flexible portion deforming when the movable portion 14b moves.

The movable portion 14b is disposed at a distal end of the beam portion 14a protruding into the opening portion 16, and hangs downwardly with the beam portion 14a and is disposed inside the opening portion 16. An upper surface 14ba of the movable portion 14b is situated at a height substantially same as that of the beam portion 14a and the frame portion 13. The movable portion 14b has a thickness A smaller than a thickness B of the frame portion 13. That is, the movable portion 14b is supported inside the opening portion 16 with the beam portion 14a.

The movable structure 15 may be disposed in, for example, a silicon wafer. The frame portion 13 is integrated with the beam portion 14a, so that the frame portion 13 supports the beam portion 14a at the connected portions thereof, and the beam portion 14a supports the movable portion 14b.

It is necessary to arrange the movable portion 14b to be movable in an arrow direction a or an arrow direction b shown in FIG. 1(B) for measuring acceleration. Accordingly, the movable portion 14b is separated from the frame portion 13 with a gap 16a and from side edges of the beam portion 14a except connected portions between the frame portion 13 and the movable portion 14b, so that the movable portion 14b does not directly contact with the frame portion 13, and the beam portion 14a does not interfere the movement of the movable portion 14b.

In the embodiment, the movable structure 15 is formed of the beam portion 14a having the four components and the movable portion 14b supported in four directions with the four components of the beam portion 14a. According to the present invention, the configuration of the acceleration sensor chip package is not limited to the embodiment, and may be applicable to configurations of any movable structures disposed in conventional acceleration sensors. For example, the configuration of the acceleration sensor chip package is applicable to a cantilever configuration in which the movable portion 14b is supported in one direction.

The acceleration sensor chip package 10 has the same size as an outer size of the acceleration sensor chip 11 in a plan view viewed from an upper surface thereof (or a lower surface). The acceleration sensor chip package 10 has a rectangular column shape, and not limited thereto. As shown in FIGS. 1(A) and 1(B), the beam portion 14a is formed of the four components protruding into the opening portion 16 from the center of each side of the upper surface 13a of the frame portion 13. The movable portion 14b is supported at distal end portions of the four components of the beam portion 14a. In the embodiment, the movable portion 14b has a cubical shape. That is, the beam portion 14a has a rectangular shape in a plan view, and the beam portion 14a is connected to center portions of four sides of a square, i.e., an upper surface of the cubic. Alternatively, the movable portion 14b may have another shape according to estimated acceleration and measurement conditions.

In the embodiment, the beam portion 14a is provided with detection elements 19 or piezo-resistance elements. An appropriate number of the detection elements 19 are disposed at appropriate positions according to a design for measuring acceleration as a measurement target. The detection elements 19 measure displacement of the movable structure 15, and are not limited to the piezo-resistance elements. For example, a detection element used in an arbitrary acceleration sensor such as an electrostatic type may be applicable.

Each of the detection elements 19 is connected to a wiring (not shown) for outputting a signal to outside or inputting a signal to the detection elements 19. The wiring may be formed of a known configuration and a known material such as aluminum (Al). A plurality of electrode pads 18 is disposed on the surface 13a of the frame portion 13 in an exposed state. In general, an insulating layer such as a passivation layer is formed on the surface of the acceleration sensor chip 11. The electrode pads 18 are exposed from the insulating layer. The electrode pads 18 are electrically connected to the detection elements 19 of the beam portion 14a through the wirings described above.

A re-wiring layer 17 is disposed on the upper surface 13a of the frame portion 13. The re-wiring layer 17 is preferably formed of a metal wiring such as copper (Cu). The re-wiring layer 17 includes a plurality of wiring portions 17a. One end of the wiring portion 17a is electrically connected to the electrode pad 18. The other end of the wiring portion 17a, i.e., the upper surface 13a of the frame portion 13, is electrically connected to an outer terminal 70. Accordingly, the outer terminal 70 is electrically connected to the detection element 19 through the re-wiring layer 17, the electrode pad 18 connected to the re-wiring layer 17, and the wiring (not shown) connected to the electrode pad 18.

In the embodiment, the outer terminal 70 is formed of an electrode post 40 electrically connected to the other end of the wiring portion 17a and a solder ball 60 electrically connected to a top surface 40a of the electrode post 40. The solder ball 60 is formed of an arbitral material such as a lead-free solder ball and a core-ball. Alternatively, the outer terminal 70 may be formed in a land shape without the solder ball 60. That is, the outer terminal 70 may be formed in an appropriate shape according to a requirement of a mounting substrate on which the acceleration sensor chip package 10 is mounted. For example, when the electrode post 40 is formed of copper, a thin layer formed of nickel (Ni) may be formed on the top surface 40a of the electrode post 40. Then, a thin layer formed of gold (Au) is formed on the nickel thin layer. Alternatively, a solder paste is applied to the top surface 40a to form a land.

As shown in FIG. 2(A), a first sealing portion 20 is disposed on the acceleration sensor chip 11, i.e., the frame portion 13. The first sealing portion 20 surrounds the opening portion 16 or the gaps 16a, and is separated from the edges of the frame portion 13 defining the opening portion 16. Accordingly, the first sealing portion 20 has a closed shape (closed ring) and an outer contour corresponding to the outer contour of the acceleration sensor chip 11. The first sealing portion 20 is arranged such that a part of each of the outer terminals 70, the top surface 40a of the electrode post 40 and the solder ball 60 in the embodiment, is exposed. Further, the first sealing portion 20 seals the electrode pads 18 and the re-wiring layer 17.

As shown in FIG. 1(B), the first sealing portion 20 has a section taken along a projected line 1(B)-1(B) having a mountain shape with an exposed portion of the outer terminal 70 as a top and two slopes extending toward the opening portion 16 of the acceleration sensor chip 11 and the outer edge. When the first sealing portion 20 has a closed ring shape, it is possible to seal the movable structure 15 in a closed space upon mounting on the substrate.

When it is not necessary to seal the movable structure 15 in a closed space, the first sealing portion 20 may be formed of a plurality of first sealing portions 20a arranged in a comb shape with gaps as shown in FIG. 2(B). In this case, each of the first sealing portions 20a has a mountain shape having slopes. Each of the first sealing portions 20a individually seals a set of the outer terminal 70, the wiring portion 17a connected to the outer terminal 70, and the electrode pad 18 connected to the wiring portion 17a. As shown in FIG. 1(B), the outer terminal 70 has a height E such that the movable structure 15 is adjustable in the arrow direction a to measure specific acceleration upon mounting.

As shown in FIG. 1(B), the acceleration sensor chip 11 is attached to a substrate 12 with a known adhesive (not shown). The substrate 12 has an upper surface 12a and a lower surface 12b opposite to the upper surface 12a. When the substrate 12 is attached to the acceleration sensor chip 11, the upper surface 12a of the substrate 12 is attached to the lower surface of the acceleration sensor chip 11 or the lower surface 13b of the frame portion 13 from below to cover the opening portion 16 (gaps 16a) from a side of the lower surface 13b.

The substrate 12 is formed of a proper material, preferably a glass substrate. The substrate 12 seals the movable structure 15 for protection and restrains the movement of the movable structure 15 in the arrow direction b in FIG. 1(B). The upper surface 12a of the substrate 12 is separated from an area other than the attachment surface of the acceleration sensor chip 11, i.e., a lower surface 14bb of the movable portion 14b, by a distance D to secure a specific displacement of the movable structure 15.

In the present invention, without a protection cover conventionally used for sealing an acceleration chip and bonding wires, it is possible to form the acceleration sensor chip package 10 having the same size as that of the chip while retaining the outer terminals, thereby greatly reducing the outer side of the package, and improving design flexibility in an arrangement of the outer terminals. Further, the outer terminals protrude from the upper surface of the acceleration sensor chip. Accordingly, it is possible to prevent the movable structure from being damaged during transportation.

An operation of the acceleration sensor chip package 10 will be explained next. When acceleration is applied to the acceleration sensor chip package 10, the movable portion 14b is displaced. Accordingly, the beam portion 14a supporting the movable portion 14b deforms by an amount proportional to the displacement of the movable portion 14b. The detection elements 19 disposed on the beam portion 14a detect the amount of the deformation as a change in resistance. The change in resistance is output to a detection circuit through the electrode pads 18 electrically connected to the detection elements 19 and the outer terminals 70, i.e., the electrode posts 40 and the solder balls 60 in the embodiment. As a result, the acceleration applied to the acceleration sensor chip package 10 is measured quantitatively.

With reference to FIGS. 3(A) and 3(B) to 7(A)-7(C), a method of producing the acceleration sensor chip package 10 will be explained next. In the invention, it is characterized that the acceleration sensor chip is produced with the process technology of Wafer Level Chip Size Package (W-CSP), in which re-wiring, forming the outer terminals, sealing, and cutting in pieces are performed at a wafer level. In the following explanation, although a plurality of the acceleration sensor chips packages is arranged in a grid pattern and produced all at once at the wafer level, two adjacent acceleration sensor chips (packages) are shown for the sake of explanation.

Figure 3A:
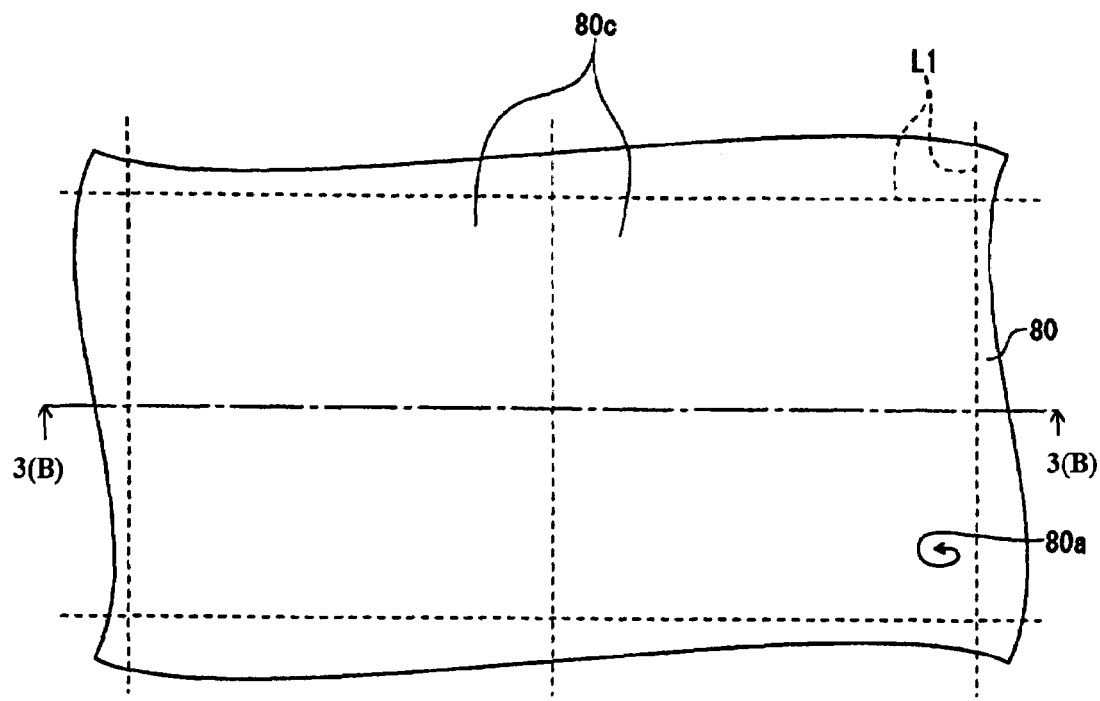
FIG. 3(A) is a schematic plan view showing the acceleration sensor chip package during a manufacturing process.
Figure 3B:
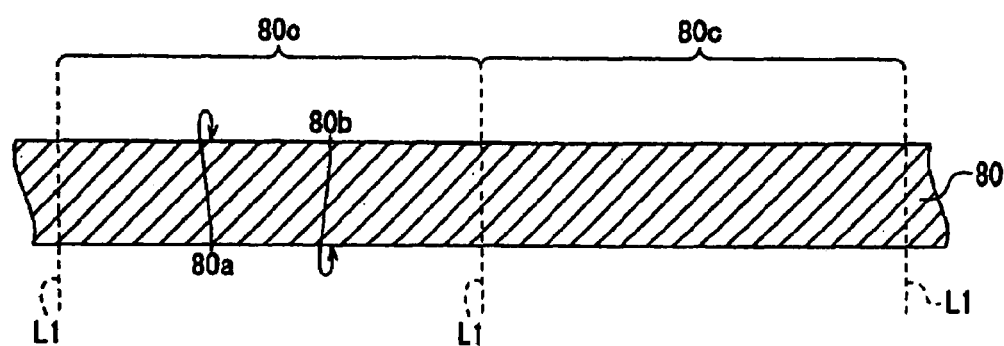
FIG. 3(B) is a sectional view taken along a projected line 3(B)-3(B) in FIG. 3(A)
Figure 4A:
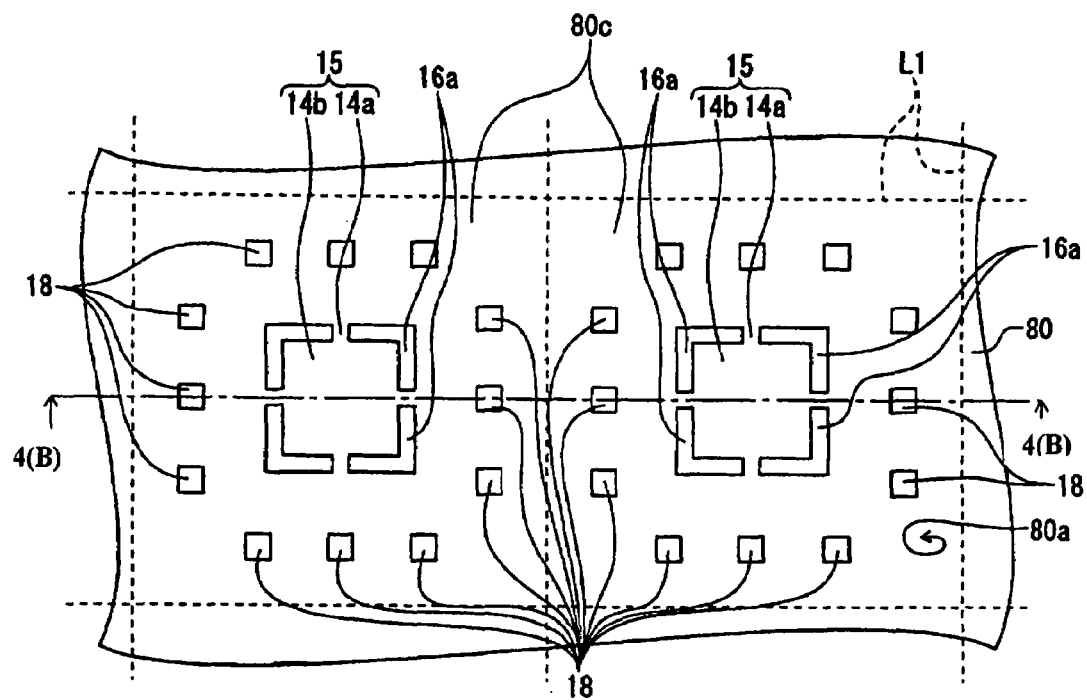
FIG. 4(A) is a schematic plan view showing the acceleration sensor chip package during the manufacturing process continued from FIG. 3(A)
Figure 4B:
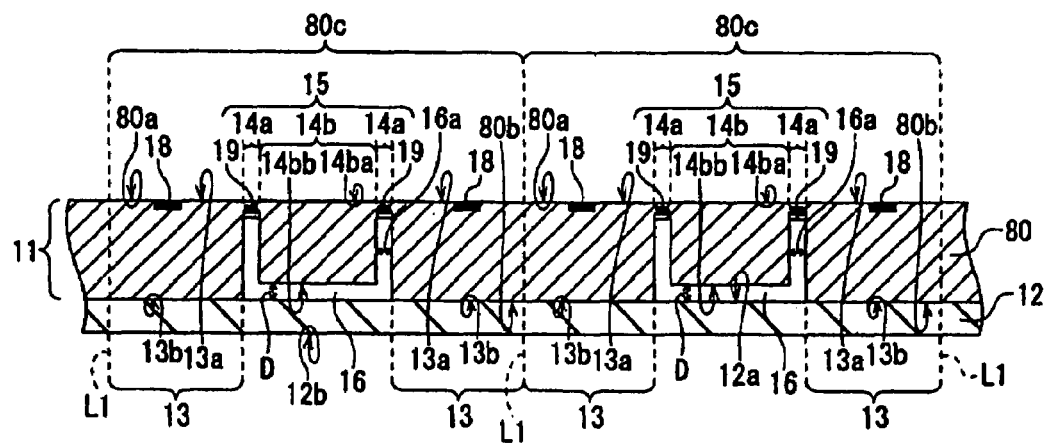
FIG. 4(B) is a sectional view taken along a projected line 4(B)-4(B) in FIG. 4(A)
Figure 5A:
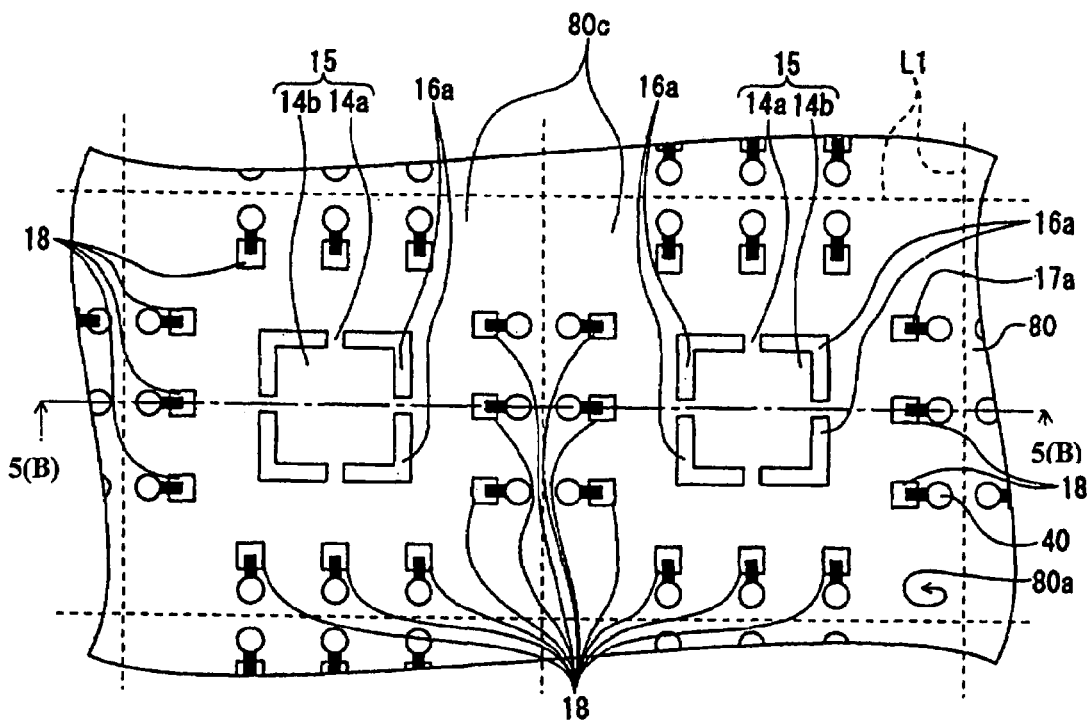
FIG. 5(A) is a schematic plan view showing the acceleration sensor chip package during the manufacturing process continued from FIG. 4(A)
Figure 5B:
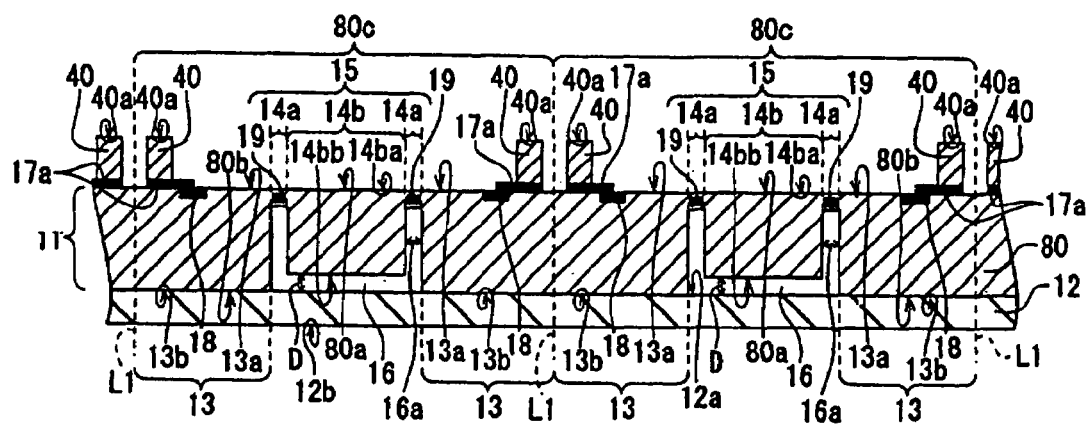
FIG. 5(B) is a sectional view taken along a projected line 5(B)-5(B) in FIG. 5(A)
Figures 6A, 6B:
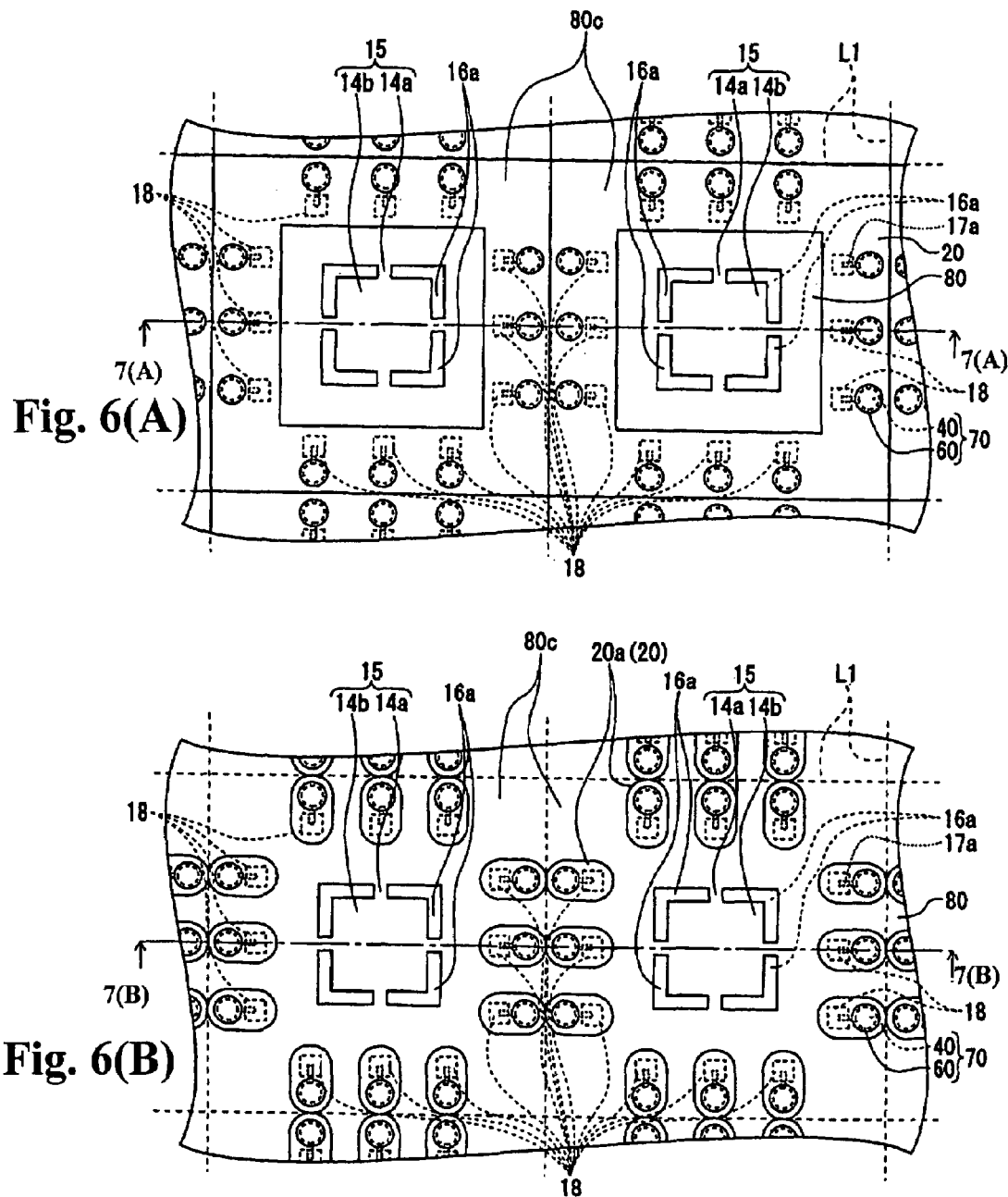
FIGS. 6(A) and 6(B) are schematic plan views showing the acceleration sensor chip package during the manufacturing process continued from FIG. 5(A)

FIG. 3(A) is a schematic plan view showing the acceleration sensor chip package during a manufacturing process, and FIG. 3(B) is a sectional view taken along a projected line 3(B)-3(B) in FIG. 3(A). FIG. 4(A) is a schematic plan view showing the acceleration sensor chip package during the manufacturing process continued from FIG. 3(A), and FIG. 4(B) is a sectional view taken along a projected line 4(B)-4(B) in FIG. 4(A). FIG. 5(A) is a schematic plan view showing the acceleration sensor chip package during the manufacturing process continued from FIG. 4(A), and FIG. 5(B) is a sectional view taken along a projected line 5(B)-5(B) in FIG. 5(A). FIGS. 6(A) and 6(B) are schematic plan views showing the acceleration sensor chip package during the manufacturing process continued from FIG. 5(A). FIGS. 7(A) to 7(C) are schematic sectional views showing the acceleration sensor chip package during the manufacturing process continued from FIGS. 6(A) and 6(B). Incidentally, FIGS. 7(A) and 7(B) are schematic sectional views taken along projected lines 7(A)-7(A) and 7(B)-7(B) in FIGS. 6(A) and 6(B), respectively.

As shown in FIGS. 3(A) and 3(B), first, a silicon wafer 80 is prepared. The silicon wafer 80 has a first surface 80a and a second surface 80b opposite to the first surface 80a. A plurality of chip regions 80c is defined on the silicon wafer 80 in advance. The chip regions 80c eventually become the acceleration sensor chip packages 10 through a process of cutting in pieces (described later). Hidden lines L1 defining the chip regions 80c are scribe lines (dicing lines). In the following explanation, two adjacent chip regions 80c may be called a first and second chip region.

In the next step, as shown in FIGS. 4(A) and 4(B), the silicon wafer 80 is process with a known photolithography process and a known etching process to integrally form the movable structure 15. That is, the movable structures 15 having an essential function of the acceleration sensor are formed in the chip regions 80c. The movable structure thus formed in the silicon wafer is also called an intermediate movable structure. As described above, the movable structure 15 includes the movable portion 14b disposed in the opening portion 16 and the beam portion 14a supporting the movable portion 14b. An outer area outside the opening portion 16 in the chip region 80c becomes the frame portion 13 (described later). The bottom surface 14bb of the movable portion 14b is processed with a known photolithography process and a known etching process to form a proper shape (bottom shape), so that the beam portion 14a has an appropriate thickness, and the distance D is formed to secure a specific displacement of the movable structure 15 of the acceleration sensor chip 11. Specific constituents of the acceleration sensor chip 11 including the intermediate movable structure 15 are formed with a known process, and detailed explanations thereof are omitted.

The detection elements 19, i.e., the piezo-resistance elements 19 in the embodiment, are formed at specific positions of the beam portion 14a for detecting acceleration. Wirings (not shown) formed of aluminum are provided with a known process such that one end portions thereof are connected to the piezo-resistance elements 19. The other end portions of the wirings extend to outer areas outside the intermediate movable structure 15, i.e., appropriate positions on the frame portion 13 (described later), in the chip region 80c. The wirings are covered with the insulating layer as described above. The electrode pads 18 exposed from the surface of the frame portion 13 are electrically connected to the other end portions of the wirings (not shown). The electrode pads 18 may be formed such that parts of the wirings are exposed from the insulating layer formed on the upper surface of the frame portion 13 and the acceleration sensor chip 11.

As shown in FIG. 4(B), the substrate 12 is attached to a remaining portion of the second surface 80b of the silicon wafer 80, so that a plurality of the opening portions 16 (the gaps 16a) arranged in a matrix pattern is covered. The remaining portion of the second surface 80b is an area between the frame portions 13 and the adjacent chip regions 80c. The substrate 12 is attached with an adhesive through a known method.

In the next step, as shown in FIGS. 5(A) and 5(B), the re-wiring layer 17 is formed on the frame portions 13 similar to a manufacturing process of a re-wiring layer in the manufacturing process of so-called W-CSP. The re-wiring layer 17 includes a plurality of the wiring portions 17a within the same layer. The re-wiring layer 17 is preferably formed of copper (Cu) or an alloy containing copper.

Specifically, first, a metal layer is formed on the frame portions 13. The metal layer is formed in a wiring pattern with known photolithography technology. The wiring portions 17a extend in the chip regions 80c, so that the end portions of the wiring portions 17a are electrically connected to the electrode pads 18. Then, the electrode posts 40 are formed on the re-wiring layer 17. In this process, after a conductive material such as copper is plated with a resist layer patterned with a known photolithography as a mask, the resist layer is removed. In the photolithography process, the resist layer is formed of a dry-developing resist, so that a dry developing process is performed. In the embodiment, the electrode posts 40 have a column shape having a circular section taken perpendicular to an extending direction (upper-to-lower direction in FIG. 5(A)).

In the next step, as shown in FIGS. 6(A) and 6(B), the first sealing portion 20 is formed using, for example, a liquid sealing resin such as an epoxy-type mold resin and a liquid sealing material. The sealing process is performed with a known process such as an injection method using a dispenser, a transfer molding method, and a printing method. The first sealing portion 20 may be formed to cover the top surfaces 40a of the electrode posts 40, and then the top surfaces 40a of the electrode posts 40 are ground to expose from the first sealing portion 20.

The first sealing portion 20 may be formed with a film forming method. In this case, during the sealing process, it is possible to reduce a load applied to the electrode posts 40. It is also possible to expose the top surfaces 40a of the electrode posts 40 without the grinding process.

In the embodiment shown in FIG. 6(A), the first sealing portion 20 is formed in a continuous closed shape in each of the chip regions 80c. In the embodiment shown in FIG. 6(B), the first sealing portion 20 is formed of a plurality of first partial sealing portions 20a. In this case, each of the first partial sealing portions 20a seals a set of one outer terminal 70, the wiring portion 17a connected to the outer terminal 70, and the electrode pad 18 connected to the wiring portion 17a.

Alternatively, as shown in FIG. 7(B), the first sealing portion 20 is formed to seal two sets of the outer terminals 70, the wiring portions 17a connected to the outer terminal 70, and the electrode pads 18 connected to the wiring portion 17a in two adjacent ship areas 80c facing each other with the scribe line L1 in between. In this case, the first sealing portion 20 seals the electrode pads 18 in the first and second chip regions 80c over the scribe line L1 between the adjacent chip regions 80c, and extends along the scribe line L1. In the embodiment, the first sealing portion 20 crosses with each other to form in a grid pattern.

When the first sealing portion 20 has such a grid pattern, it is possible to form the first sealing portion 20 with a simple process. Further, it is possible to reduce a distance between the outer terminals 70 with the scribe lines L1 in between. Accordingly, it is possible to reduce an amount of the sealing resin, thereby reducing manufacturing cost.

Further, the first sealing portion 20 may be formed with a process combined the processes shown in FIG. 6(B) and FIG. 2(B). That is, the set of the outer terminal 70, the wiring portion 17a connected to the outer terminal 70, and the electrode pad 18 in the first chip region 80c is combined with another set of the outer terminal 70, the wiring portion 17a connected to the outer terminal 70, and the electrode pad 18 in the second chip region 80c. A plurality of the first sealing portions 20 is formed to seal the combined sets over the scribe line L1 between the adjacent chip regions 80c, so that parts of the outer terminals 70 adjacent in a shortest distance are exposed. In this process, a plurality of the first sealing portions 20 is formed, thereby further reducing an amount of the sealing resin.

An appropriate process may be performed on the top surfaces 40a of the electrode posts 40 according to a design requirement. When the electrode posts 40 are formed of copper, for example, a thin layer formed of Nickel (Ni) or gold (Au) may be formed on the top surfaces 40a of the electrode posts 40.

In the next step, the solder balls 60 are disposed on the top surfaces 40a of the electrode posts 40 with a known process. In the embodiment, the outer terminals 70 are formed of the electrode posts 40 and the solder balls 60. Alternatively, the outer terminals 70 may be formed of a planer structure such as a land in which parts of the wiring portions 17a are exposed from the first sealing portion 20 without using the electrode posts 40. Further, the outer terminals 70 may be formed of the top surfaces 40a of the electrode posts 40 exposed form the first sealing portion 20. After this step, the acceleration sensor chip packages 10 are completely packaged at the wafer level.

In the next step, a dicing process is performed on the areas between the adjacent chip regions 80c shown in FIGS. 7(A) and 7(B) along the scribe lines L1 with a known dicing machine. Accordingly, as shown in FIG. 7(C), it is possible to produce a plurality of the acceleration sensor chip packages 10 having an identical structure from one single wafer. When the acceleration sensor chip packages 10 shown in FIG. 7(C) are diced, an outer shape outside the outer terminals 70 of the first sealing portion 20 (first partial sealing portions 20a) is a flat shape (not shown) corresponding to an outer side surface of the frame portions 13.

In the method of producing the acceleration sensor chip packages 10 according to the embodiment of the present invention, the electrode pads 18 of the acceleration sensor chip 11 is rewired with the W-CSP process, and the outer terminals 70 are formed at the appropriate positions. It is also possible to efficiently produce the acceleration sensor chip packages 10 having the shape same as that of the acceleration sensor chip 11 in a plan view. It is unnecessary to provide an additional production line, and it is possible to produce the acceleration sensor chip packages 10 with cost substantially same as that of producing a conventional semiconductor device.

A mounted structure in which the acceleration sensor chip package is mounted on a mounting substrate will be explained next. The mounted structure and a method of mounting will be explained with reference to FIGS. 8(A), 8(B), 9(A), and 9(B). The acceleration sensor chip package has the structure of the acceleration sensor chip package 10 described above. The same reference numerals denote the same components, and explanations thereof are omitted.

Figure 8A:
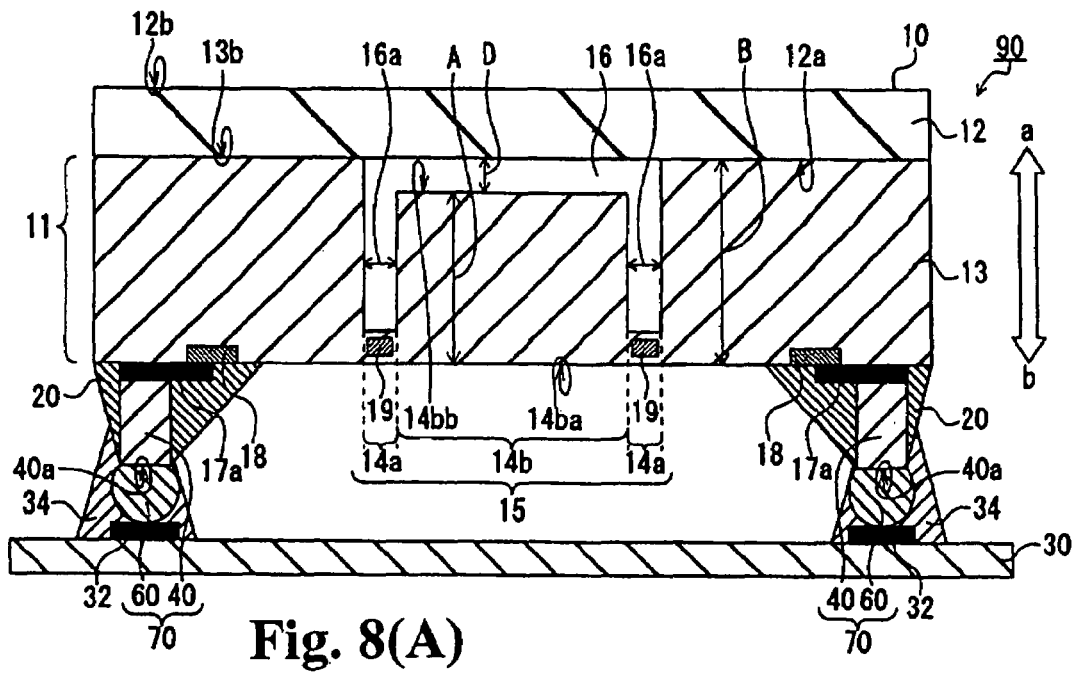
FIGS. 8(A) and 8(B) are schematic sectional views showing a mounted structure of the acceleration sensor chip package.
Figure 8B:
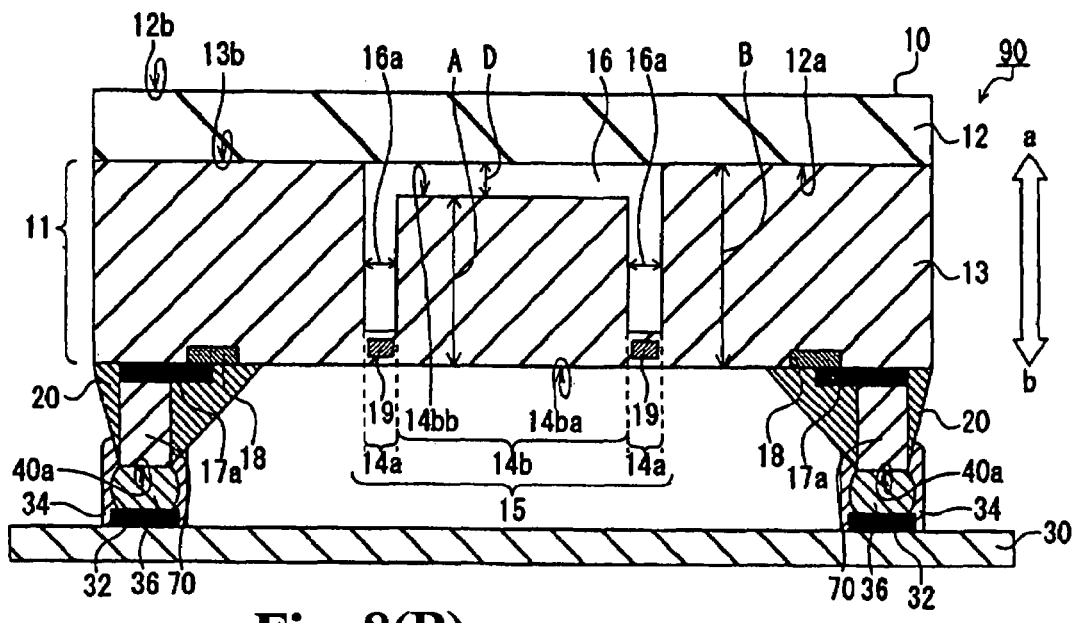
Figure 9A:
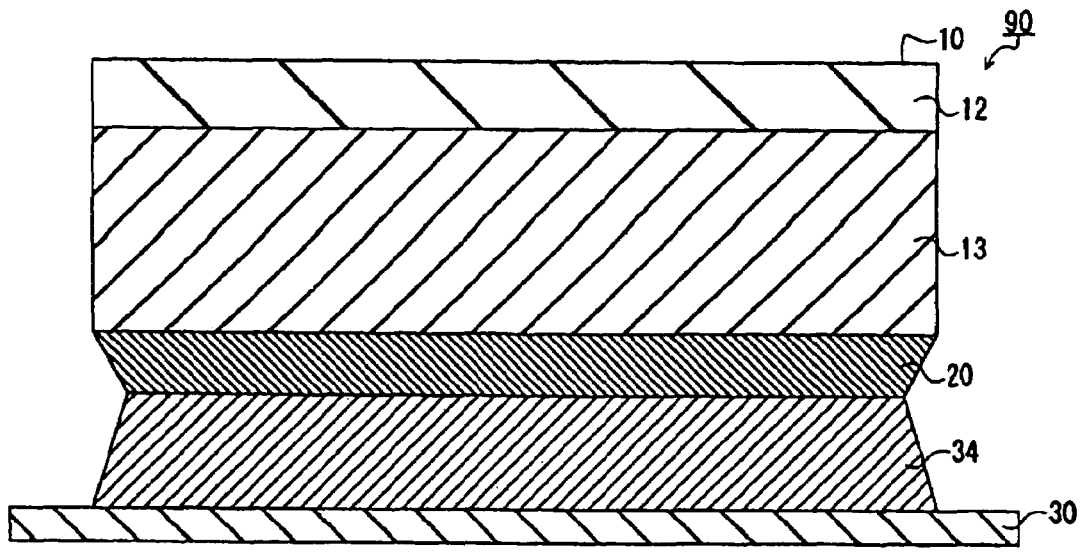
FIGS. 9(A) and 9(B) are schematic side views showing the mounted structure of the acceleration sensor chip package.
Figure 9B:
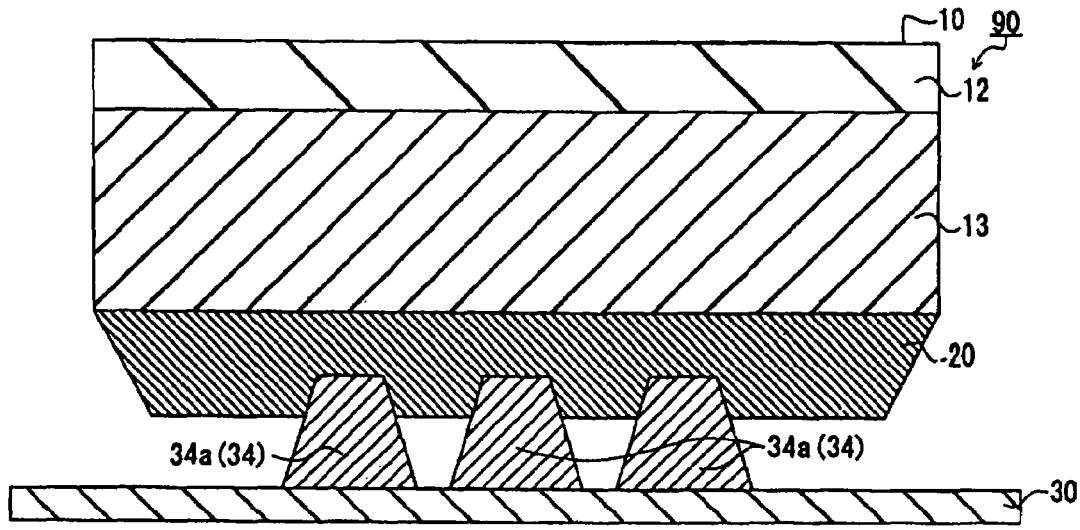

FIGS. 8(A) and 8(B) are schematic sectional views showing the mounted structure taken along the projected lines in the plan views of the acceleration sensor chip package 10. FIGS. 9(A) and 9(B) are schematic side views showing the mounted structure of the acceleration sensor chip package. As shown in FIG. 8(A), in a mounted structure 90, the acceleration sensor chip package 10 is mounted on a mounting substrate 30.

The mounting substrate 30 is provided with mounting substrate electrode pads 32 exposed from a surface thereof. The mounting substrate electrode pads 32 may be coated with solder paste or provided with bumps (not shown) as a connecting structure in advance. The mounting substrate electrode pads 32 are connected to the outer terminals 70 extending from the acceleration sensor chip package 10 or the acceleration sensor chip 11. In the embodiment, the solder balls 60 face and contact with the mounting substrate electrode pads 32.

The mounted structure 90 includes second sealing portions 34 for sealing parts of the first sealing portions 20 covering the outer terminals 70 on the mounting substrate 30, the outer terminals 70, and the mounting substrate electrode pads 32. In the embodiment, the second sealing portions 34 seal the solder balls 60 and the mounting substrate electrode pads 32.

As shown in FIG. 9(A), the second sealing portion 34 may be formed in a continuous closed shape for sealing all of the outer terminals 70. When the second sealing portion 34 has a continuous closed shape, the movable structure 15 is sealed in a closed space defined by the mounting substrate 30, the first and second sealing portions 20 and 34, and the substrate 12. When the first sealing portion 20 is formed of the first partial sealing portions 20a arranged in a comb pattern, the second sealing portion 34 may be provided with gaps between the first partial sealing portions 20a.

Alternatively, as shown in FIG. 9(B), the second sealing portion 34 may be formed of a plurality of second partial sealing portions 34a each for sealing a set of one outer terminal 70 and one mounting substrate electrode pad 32 connected thereto. When the first sealing portion 20 has a continuous closed ring shape, gaps may be formed between the first sealing portion 20 and the second partial sealing portions 34a connected thereto. When the first sealing portion 20 is formed of the first partial sealing portions 20a, gaps may be formed between the first partial sealing portions 20a.

A process of mounting the acceleration sensor chip package 10 on the mounting substrate 30 will be explained next with reference to FIGS. 8(A), 8(B), 9(A), and 9(B). First, the acceleration sensor chip package 10 and the mounting substrate 30 with a plurality of the mounting substrate electrode pads 32 are prepared. Then, the outer terminals 70 are connected to the mounting substrate electrode pads 32 followed by the sealing process through one of the following two methods.

In the first method, as shown in FIG. 8(A), the outer terminals 70 or the solder balls 60 face the mounting substrate electrode pads 32 one to one, and the acceleration sensor chip package 10 is placed on the mounting substrate 30. In the embodiment, the mounting substrate electrode pads 32 are coated with solder paste (not shown) in advance.

In the next step, a re-flow process is performed using a known re-flow bath with a known method, so that the outer terminals 70 or the solder balls 60 are melted and attached to the mounting substrate electrode pads 32. Then, a resin material is supplied using a known dispenser with a dispenser method to form the second sealing portion 34. The second sealing portion 34 covers a part of the first sealing portion 20 of the acceleration sensor chip package 10, the outer terminals 70 (solder balls 60), and the mounting substrate electrode pads 32 connected thereto. The resin material includes a known non-flow type liquid resin.

In the step of supplying the resin material, the resin material is supplied in a closed shape as shown in FIG. 9(A) to form the second sealing portions 30. Alternatively, as shown in FIG. 9(B), the resin material may be supplied to each of the outer terminals 70. When the resin material is supplied, the resin material may flow to the mounting surface below the outer terminals 70, the frame portion 13 inside the mounting substrate electrode pads 32, or the movable structure 15. In this case, as far as the movable structure 15 is not interfered, the resin material does not cause a problem.

Lastly, the resin material is cured under an appropriate condition to form the second sealing portion 34. Accordingly, through the steps described above, the mounted structure 90 including the acceleration sensor chip package 10 is completed.

In the second method, the acceleration sensor chip package 10 is mounted with a press-contact process. First, like the first method, the mounting substrate 30 is prepared. As shown in FIG. 8(B), bumps 36 are formed on the mounting substrate 30. Then, a resin material is supplied in a closed ring shape or to each of the mounting substrate electrode pads 32 and the bumps 36, as shown in FIG. 9(A) or 9(B), so that the second sealing portion 34 covers the mounting substrate electrode pads 32 and the bumps 36.

The resin material includes Non-Conductive Paste (NCP) or Anisotropic Conductive Paste (ACP) as a known press-contact paste. Alternatively, a known press-contact film such as Non-conductive Film (NCF) and Anisotropic Conductive Film (ACF) may be used.

In the next step, the outer terminals 70 are pressed against the mounting substrate electrode pads 32 one to one through the bumps 36 with a known process. Accordingly, the outer terminals 70 penetrate the resin material and contact with the bumps 36, so that the outer terminals 70 are electrically connected to the mounting substrate electrode pads 32. The resin material is cured to form the second sealing portion 34 (second partial sealing portions 34a), thereby fixing the outer terminals 70 to the mounting substrate electrode pads 32. In the embodiment, the bumps 36 are disposed on the mounting substrate electrode pads 32, and may be disposed on the outer terminals 70 in advance. Through the steps described above, the mounted structure 90 including the acceleration sensor chip package 10 is completed as shown in FIG. 8(B).

Second Embodiment

A second embodiment of the present invention will be explained with reference to FIGS. 10(A), 10(B), 11(A), and 11(B). In the acceleration sensor chip package 10 of the second embodiment, the outer terminals 70 have exposed surfaces exposed from the side surface of the acceleration sensor chip package 10, or the side surface of the first sealing portion 20. Except the outer terminals 70 and the first sealing portion 20, the configuration of the second embodiment is similar to that of the first embodiment. Accordingly, the same reference numerals denote components same as those in the first embodiment, and explanations thereof are omitted.

Figure 10A:
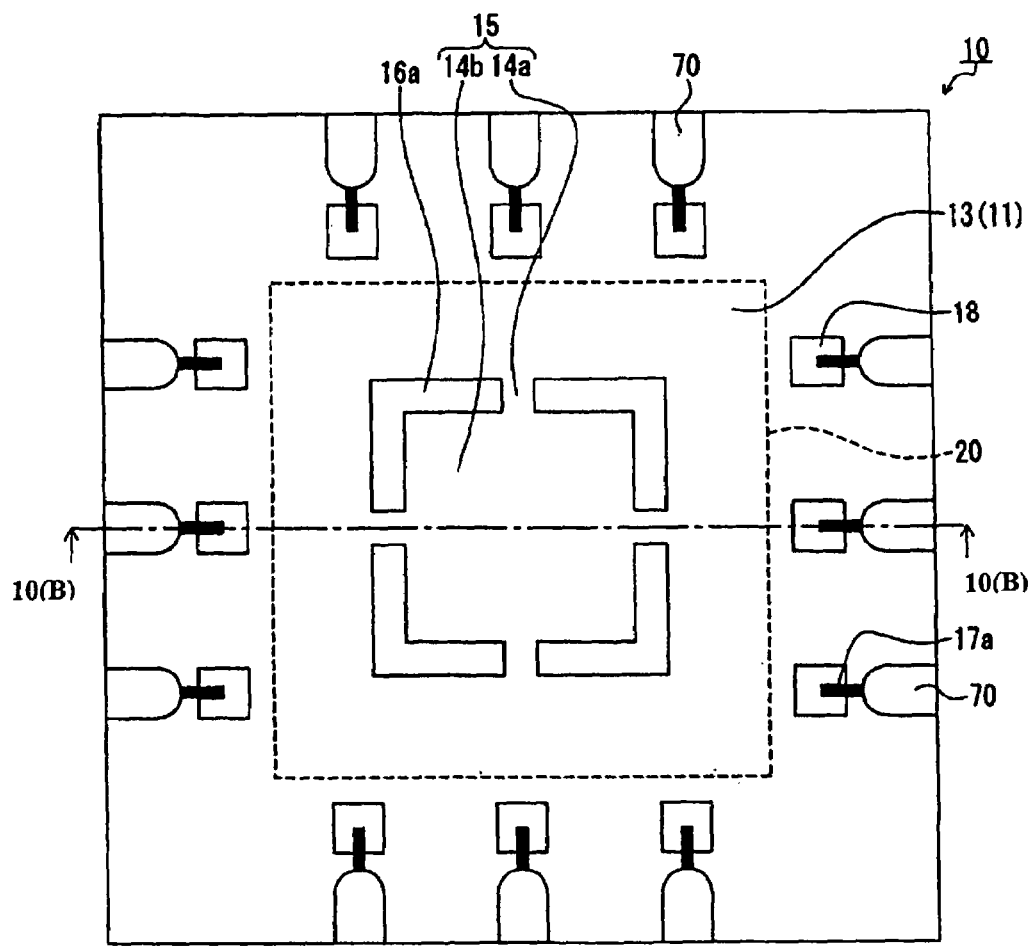
FIG. 10(A) is a schematic plan view showing an acceleration sensor chip package viewed from above for explaining constituents thereof according to a second embodiment of the present invention.
Figure 10B:
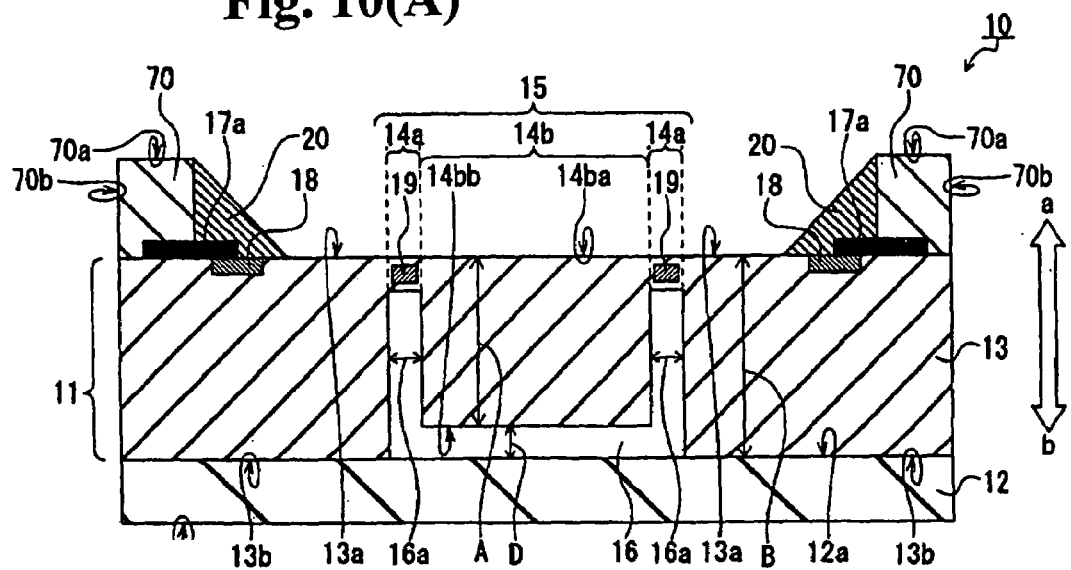
FIG. 10(B) is a sectional view taken along a projected line 10(B)-10(B) in FIG. 10(A)
Figure 11A:
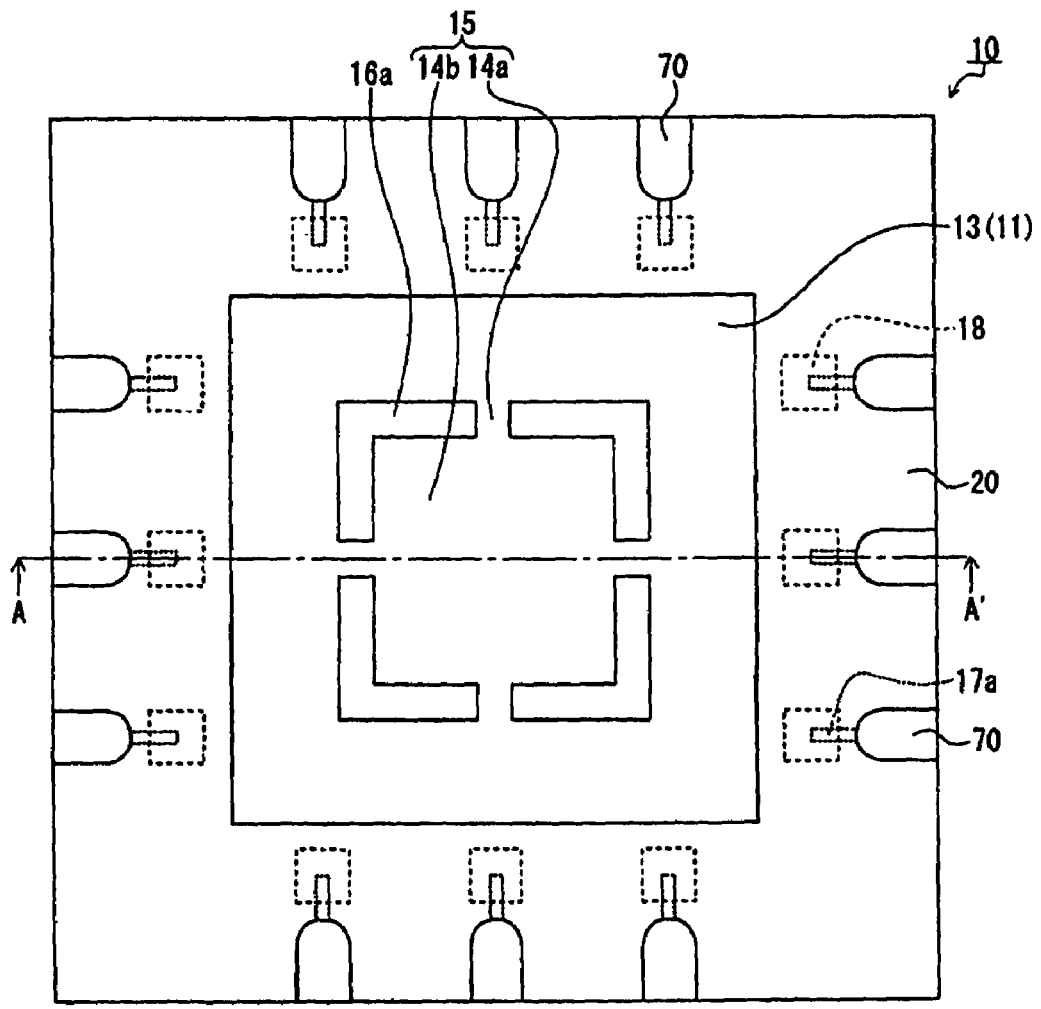
FIG. 11(A) is a schematic plan view of the acceleration sensor chip package for explaining constituents thereof according to the second embodiment of the present invention.
Figure 11B:
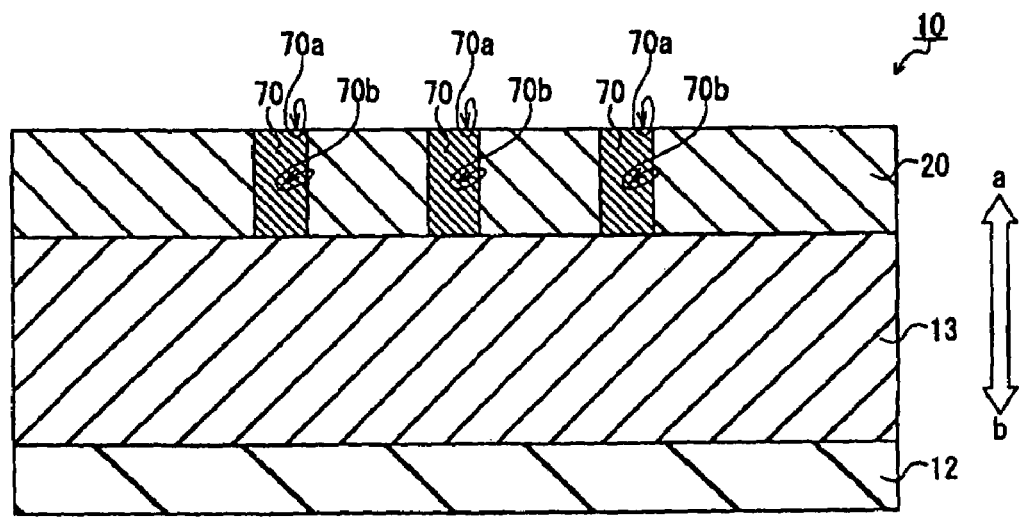
FIG. 11(B) is a side view thereof.

FIG. 10(A) is a schematic plan view showing the acceleration sensor chip package viewed from above for explaining constituents thereof according to the second embodiment of the present invention. For the sake of the explanation, the sealing portion situated on the top surface is omitted. FIG. 10(B) is a sectional view taken along a projected line 10(B)-10(B) in FIG. 10(A). FIG. 11(A) is a schematic plan view of the acceleration sensor chip package viewed from above for explaining the constituents thereof according to the second embodiment of the present invention. FIG. 11(B) is a side view of the acceleration sensor chip package.

As shown in FIGS. 10(A) and 10(B), the acceleration sensor chip package 10 is provided with the acceleration sensor chip 11. The acceleration sensor chip 11 is provided with the frame portion 13. In the embodiment, the frame portion 13 forms an outer frame with a rectangular shape defining an outer shape (contour) of the acceleration sensor chip 11. A plurality of electrode pads 18 is disposed on the surface 13a of the frame portion 13 in an exposed state. The electrode pads 18 are electrically connected to the detection elements 19 of the beam portion 14a through the wirings (not shown).

The re-wiring layer 17 is disposed on the upper surface 13a of the frame portion 13. The re-wiring layer 17 includes a plurality of the wiring portions 17a. One end of the wiring portion 17a is electrically connected to the electrode pad 18. The other end of the wiring portion 17a is electrically connected to the outer terminal 70.

As shown in FIGS. 10(A) and 10(B), the outer terminal 70 is formed of an electrode with a column shape connected to the other end of the wiring portion 17a. In the embodiment, the outer terminal 70 has an exposed surface 70b as one of side surfaces thereof on a plane same as the side surface of the acceleration sensor chip 11, i.e., an end edge surface defining the outer contour of the frame portion 13. The outer terminal 70 also has a flat shape in which the solder ball 60 is not disposed on the top surface 70a thereof.

As shown in FIGS. 10(A), 11(A), and 11(B), the first sealing portion 20 is disposed on the acceleration sensor chip 11 or the frame portion 13. The first sealing portion 20 surrounds the opening portion 16 or the gaps 16a, and is separated from the end edge of the frame portion 13 defining the opening portion 16. The first sealing portion 20 is arranged such that a part of each of the outer terminals 70, i.e., the top surface 70a and the exposed surface 70b of the outer terminal 70 in the embodiment, is exposed. Further, the first sealing portion 20 seals the electrode pads 18 and the re-wiring layer 17.

As shown in FIG. 10(B), the first sealing portion 20 has a section taken along a projected line 10(B)-10(B) in FIG. 10(A) having a mountain shape with the top surface 70a of the outer terminal 70 as a top and one slope extending toward the end edge of the opening portion 16 of the acceleration sensor chip 11. When the first sealing portion 20 has the closed shape, it is possible to seal the movable structure 15 in a closed space upon mounting on the substrate. When it is not necessary to seal the movable structure 15 in a closed space, the first sealing portion 20 may be formed of a plurality of first sealing portions 20a arranged in a comb shape with gaps. In this case, each of the first sealing portions 20a seals a set of the outer terminal 17, the wiring portion 17a connected to the outer terminal 17, and the electrode pad 18 connected to the wiring portion 17a.

The acceleration sensor chip package 10 of the second embodiment has an effect same as that of the first embodiment. An operation of the acceleration sensor chip package 10 of the second embodiment is the same as that of the acceleration sensor chip package of the first embodiment, and explanation thereof is omitted.

With reference to FIGS. 12(A), 12(B), 13(A), 13(B), 14(A), and 14(B), a method of producing the acceleration sensor chip package 10 of the second embodiment will be explained next. Explanations of steps in the second embodiment similar to those in the first embodiment may be omitted.

Figure 12A:
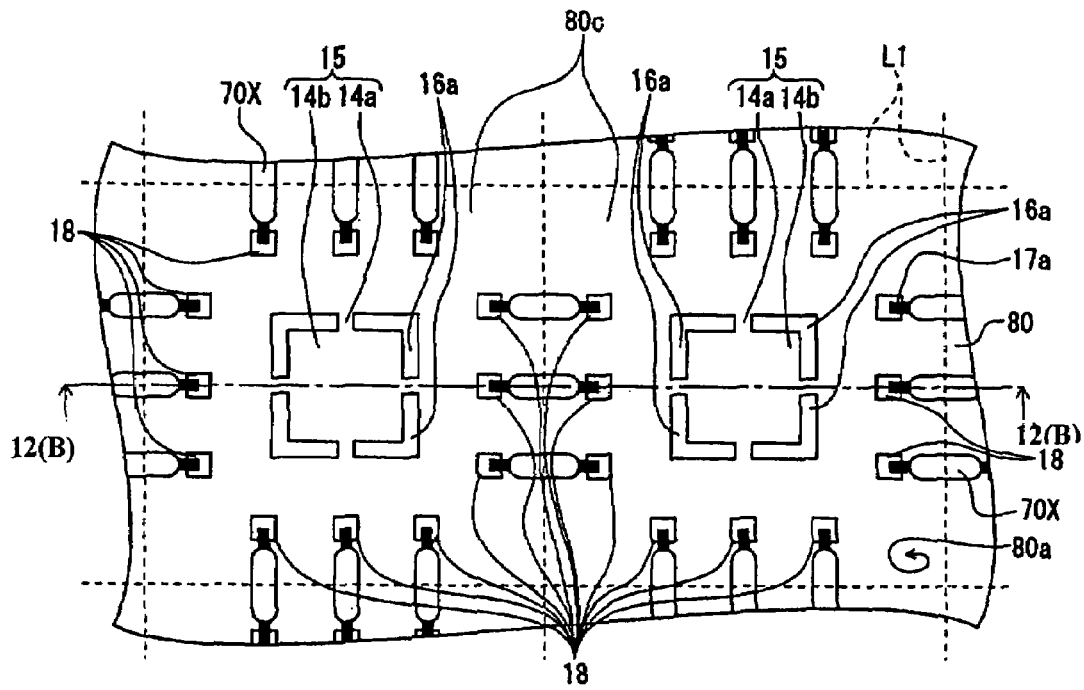
FIG. 12(A) is a schematic plan view showing the acceleration sensor chip package during a manufacturing process.
Figure 12B:
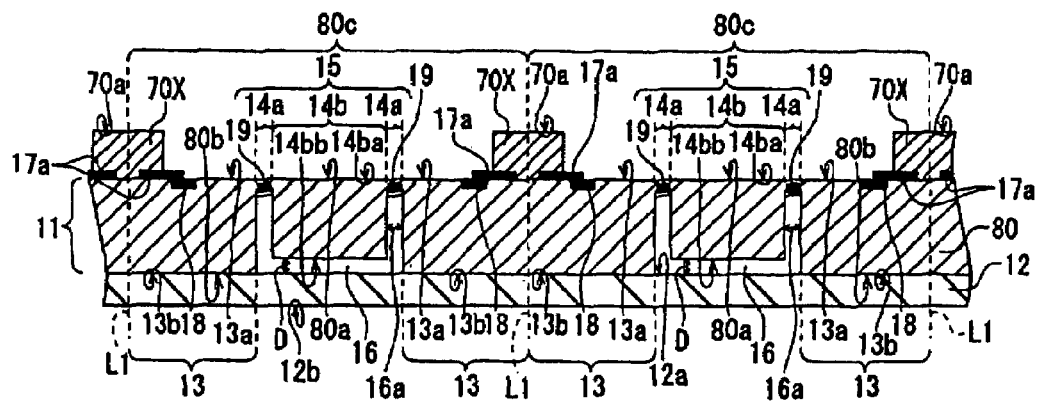
FIG. 12(B) is a sectional view taken along a projected line 12(B)-12(B) in FIG. 12(A)
Figure 13A:
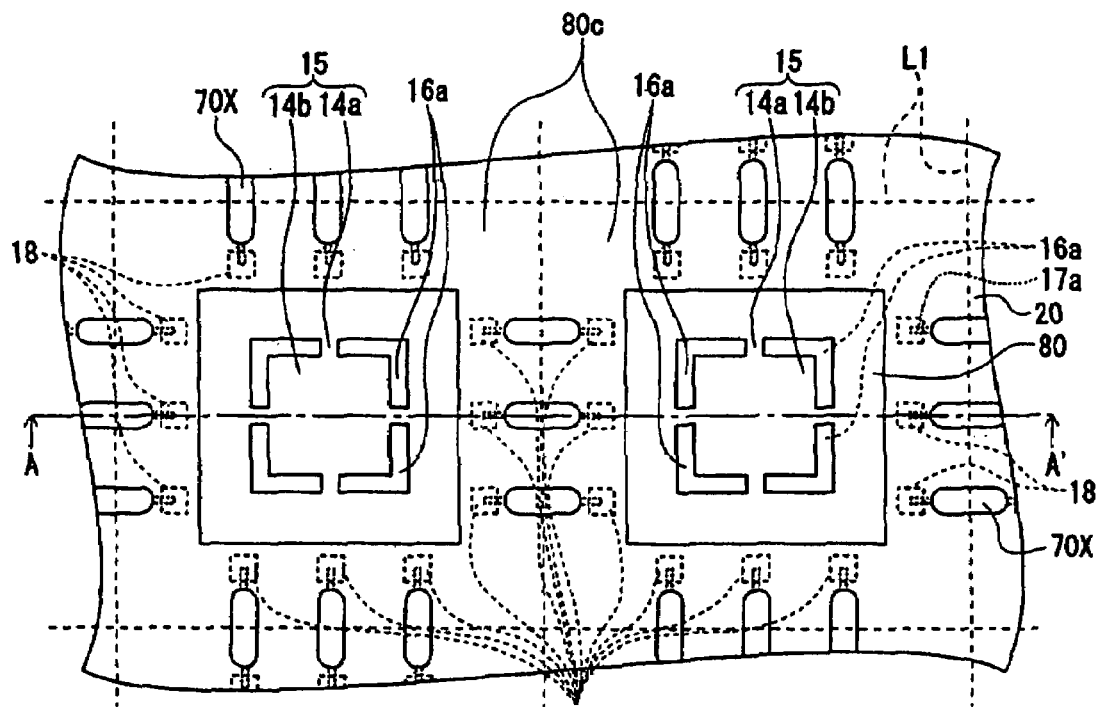
FIGS. 13(A) and 13(B) are schematic plan views showing the acceleration sensor chip package during the manufacturing process continued from FIG. 12(A)
Figure 13B:
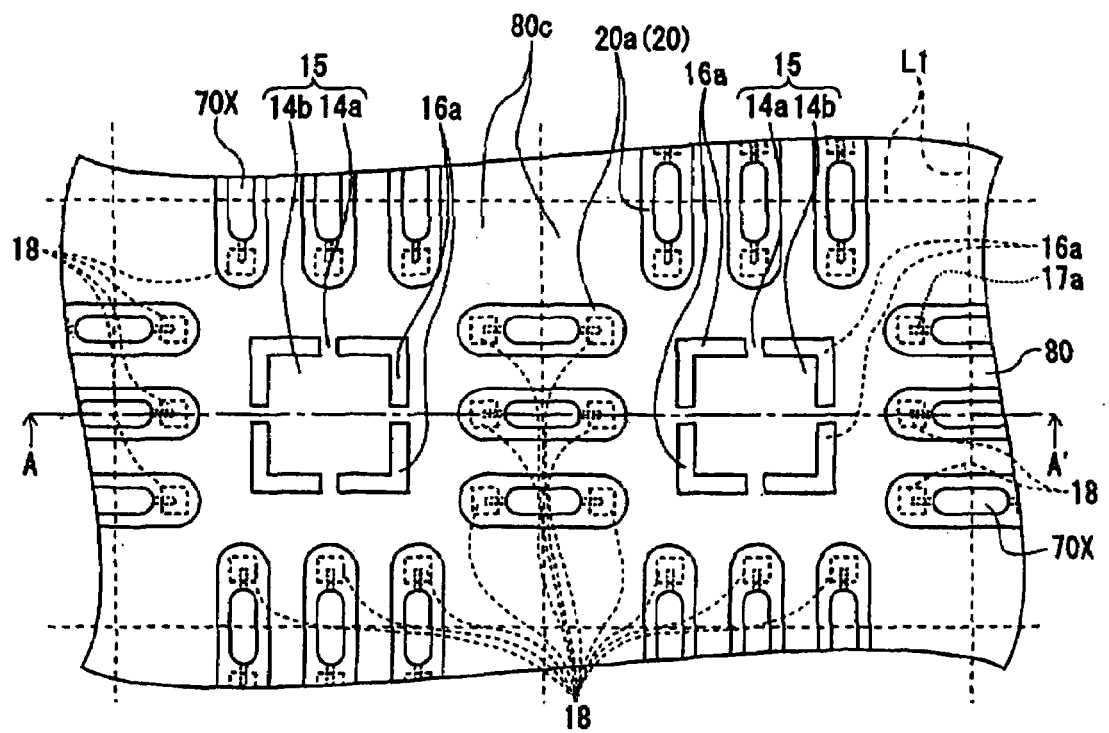
Figure 14A:
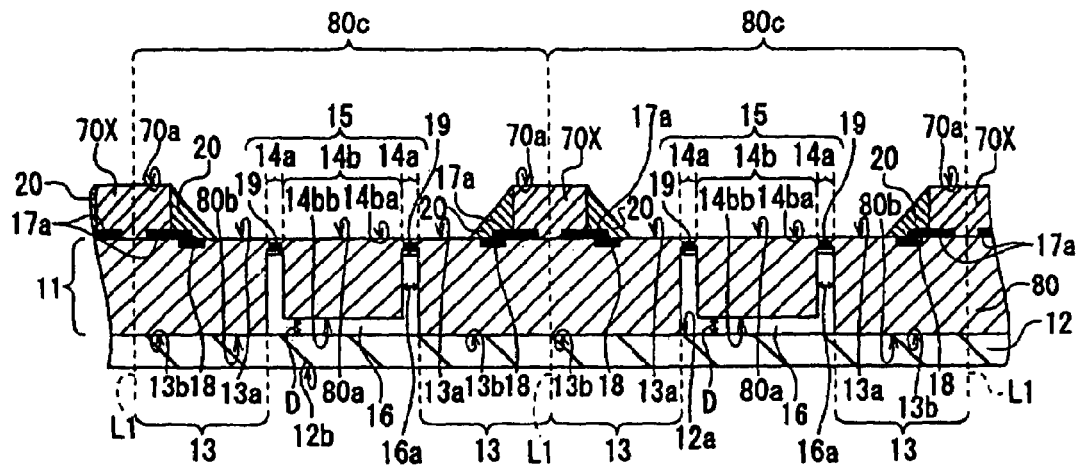
FIGS. 14(A) and 14(B) are schematic sectional views showing the acceleration sensor chip package during the manufacturing process continued from FIGS. 13(A) and 13(B)
Figure 14B:
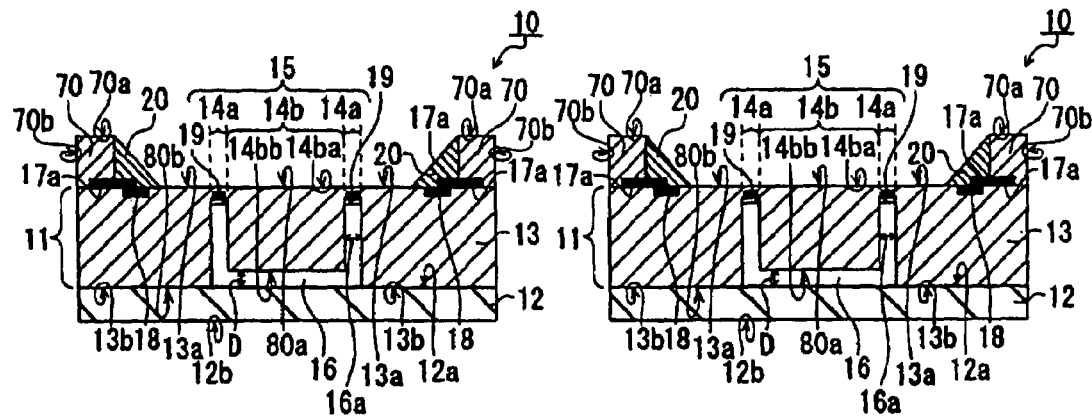

FIG. 12(A) is a schematic plan view showing the acceleration sensor chip package at a wafer level during a manufacturing process, and FIG. 12(B) is a sectional view taken along a projected line 12(B)-12(B) in FIG. 12(A). FIGS. 13(A) and 13(B) are schematic plan views showing the acceleration sensor chip package during the manufacturing process continued from FIG. 12(A). FIGS. 14(A) and 14(B) are schematic sectional views showing the acceleration sensor chip package during the manufacturing process continued from FIGS. 13(A) and 13(B)

The movable structure 15, the detection elements 19, the electrode pads 18, and the re-wiring layer 17 having the wiring portions 17a are produced with a method same as that in the first embodiment. Intermediate outer terminals 70X are formed on the re-wiring layer 17 with a method same as that of the electrode posts 40 in the first embodiment. The intermediate outer terminals 70X have a column shape having an oval section perpendicular to an upper-to-lower direction in FIG. 12(A) formed of two parallel straight lines (long axes) with both ends connected through curved lines.

The intermediate outer terminals 70X extend over the scribe lines L1 between the adjacent chip regions 80c, so that the long axes thereof are arranged perpendicular to the scribe lines L1, and are intersected equally in half with the scribe lines L1.

In the next step, as shown in FIGS. 13(A) and 13(B), the first sealing portion 20 is formed with a method same as that in the first embodiment, so that the top surfaces 70a of the intermediate outer terminals 70X are exposed. In the embodiment shown in FIG. 13(A), the first sealing portion 20 continuously seals a set of the intermediate outer terminal 70X extending over the adjacent chip regions 80c with the scribe line L1 in between, the wiring portion 17a connected to the intermediate outer terminal 70X, and the electrode pad 18 connected to the wiring portion 17a. In this case, the first sealing portion 20 is formed in a linear shape extending over the adjacent chip regions 80c with the scribe line L1 in between along the scribe line L1 to seal the electrode pads 18 in both of the adjacent chip regions 80c. Accordingly, the first sealing portion 20 is formed in a grid pattern crossing with each other.

In the embodiment shown in FIG. 13(B), the first sealing portion 20 is formed of a plurality of the first sealing portions 20a extending over the scribe lines L1. Each of the first sealing portions 20a individually seals a set of the intermediate outer terminal 70X, the wiring portion 17a connected to the intermediate outer terminal 70X and extending from the adjacent chip regions 80c, and the electrode pad 18 connected to the wiring portion 17a.

The top surface 70a of the intermediate outer terminal 70X may be treated with an appropriate process according to design. For example, when the electrode posts 40 are formed of copper, a thin Nickel (Ni) layer or a thin gold (Au) layer may be formed on the top surface 70a of the intermediate outer terminal 70X as a barrier metal layer. In the embodiment, the intermediate outer terminal 70X has a flat shape without the sold ball 60 on the top surface 70a thereof. The top surface 70a may be coated with solder paste in advance according to the mounting process.

Through the steps described above, the acceleration sensor chip package 10 is completely packaged at the wafer level. In the next step, the dicing process is performed on the areas between the adjacent chip regions 80c shown in FIG. 14(A) along the scribe lines L1 with a known dicing machine.

Accordingly, as shown in FIG. 14(B), it is possible to produce a plurality of the acceleration sensor chip packages 10 having an identical structure from one single wafer. In the embodiment, at this step, the intermediate outer terminals 70X are finished as the outer terminals 70, and the exposed surfaces 70b are formed at the same time. Accordingly, the exposed surfaces 70b of the outer terminals 70 have a flat shape flash with the outer side surfaces of the frame portion 13.

In the method of producing the acceleration sensor chip packages 10 according to the embodiment of the present invention, the electrode pads 18 of the acceleration sensor chip 11 is rewired with the W-CSP process, and the outer terminals 70 are formed at the appropriate positions. It is also possible to efficiently produce the acceleration sensor chip packages 10 having the shape same as that of the acceleration sensor chip 11 in a plan view. It is unnecessary to provide an additional production line, and it is possible to produce the acceleration sensor chip packages 10 with cost substantially same as that of producing a conventional semiconductor device. Further, the intermediate outer terminals 70X are formed over the two adjacent chip regions 80c, thereby making the intermediate outer terminals 70X smaller than an area of the chip regions 80c.

A mounted structure in which the acceleration sensor chip package is mounted on a mounting substrate will be explained next. The mounted structure and a method of mounting will be explained with reference to FIGS. 15(A), 15(B), 16(A), and 16(B). The acceleration sensor chip package has the structure of the acceleration sensor chip package 10 of the second embodiment described above. The same reference numerals denote the same components, and explanations thereof are omitted.

Figure 15A:
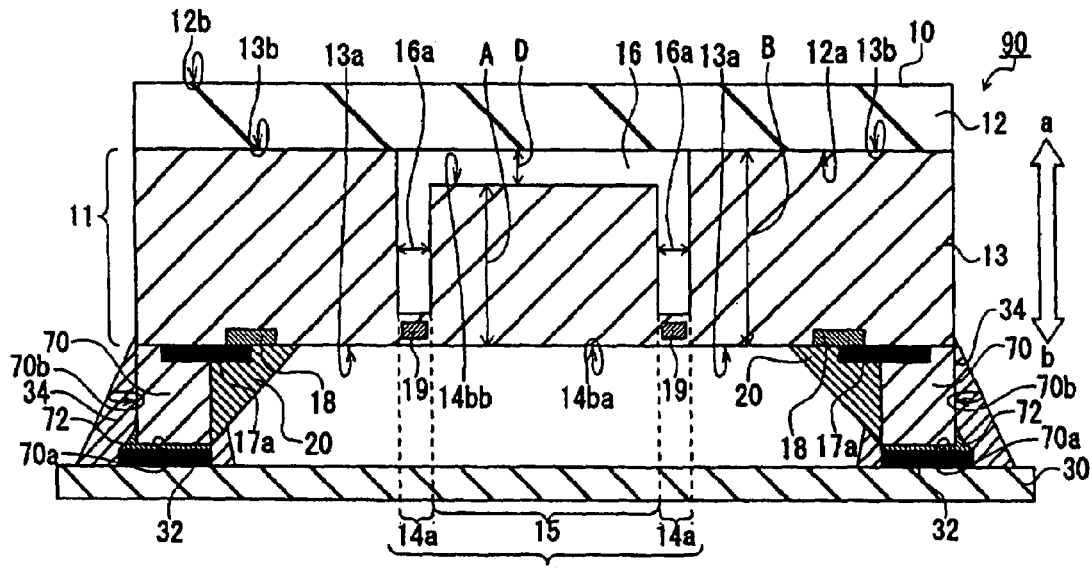
FIGS. 15(A) and 15(B) are schematic sectional views showing a mounted structure of the acceleration sensor chip package.
Figure 15B:
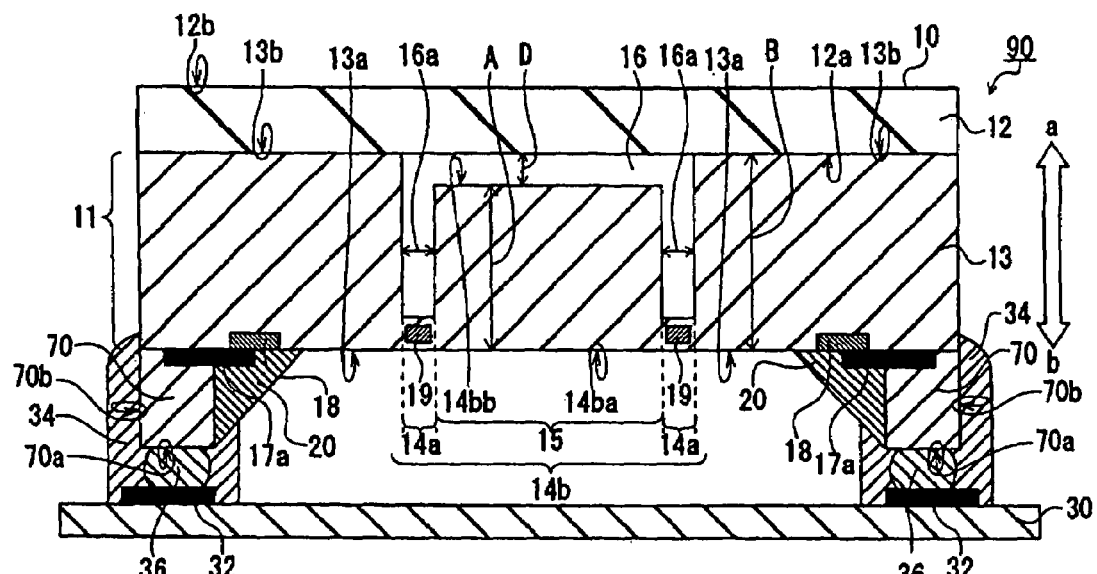
Figure 16A:
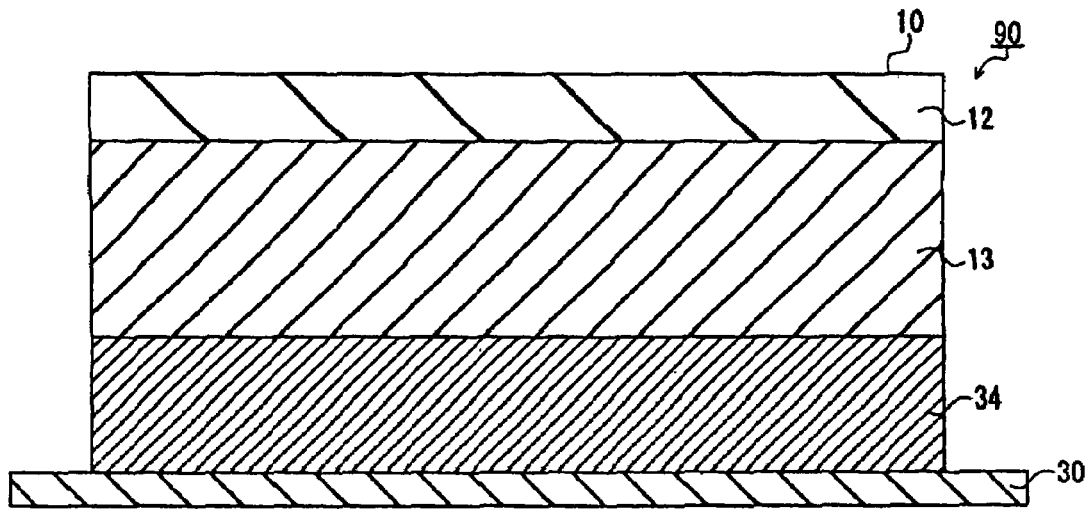
FIGS. 16(A) and 16(B) are schematic side views showing the mounted structure of the acceleration sensor chip package.
Figure 16B:
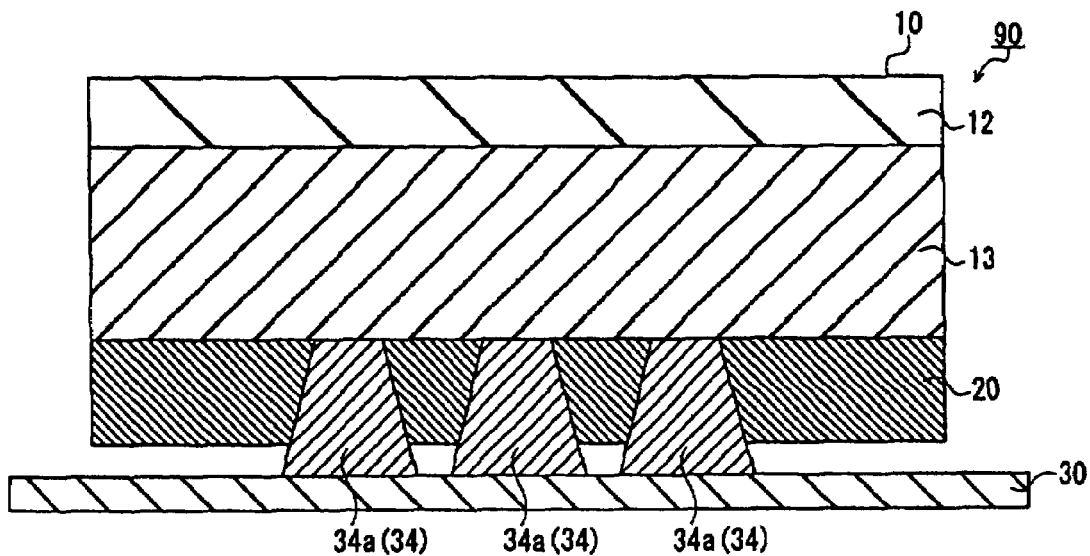
Figure 17A:
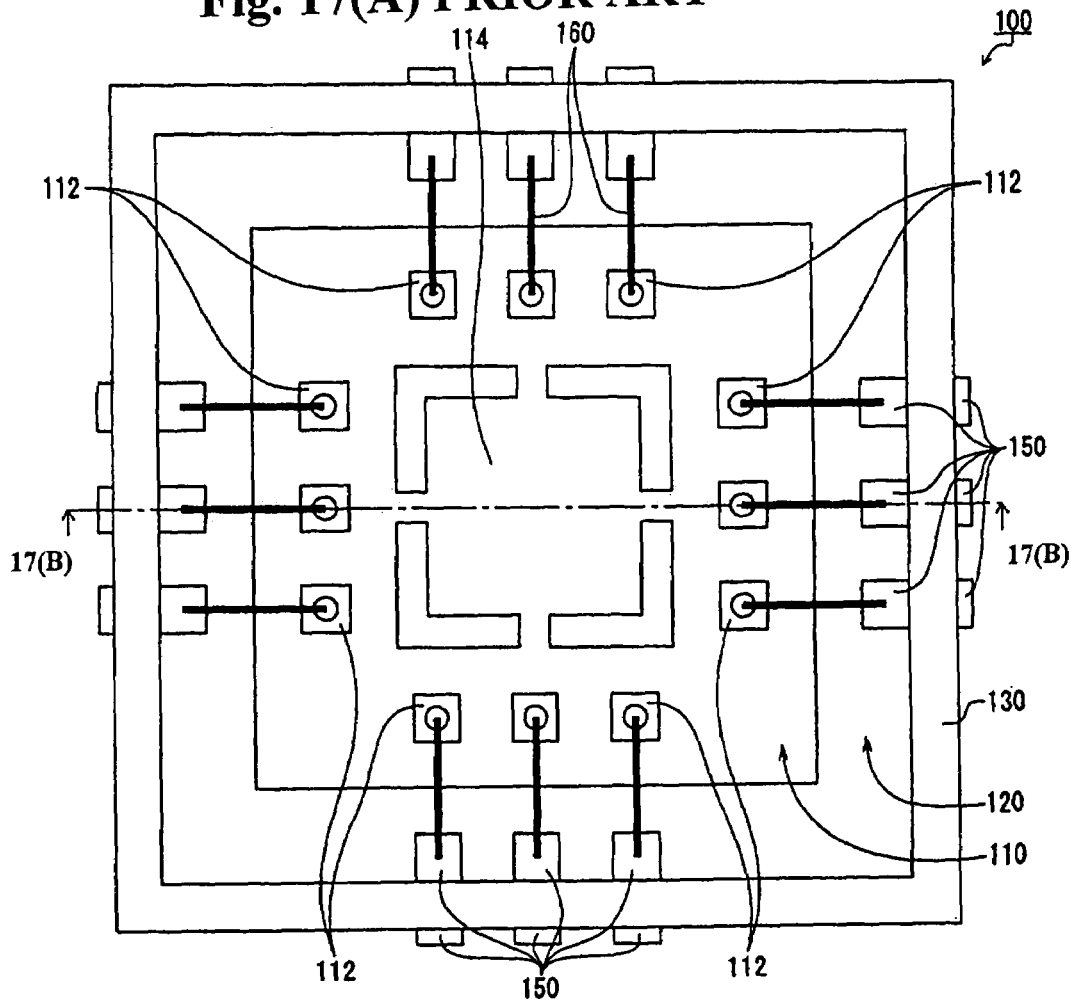
FIG. 17(A) is a schematic plan view showing a conventional acceleration sensor chip package.
Figure 17B:
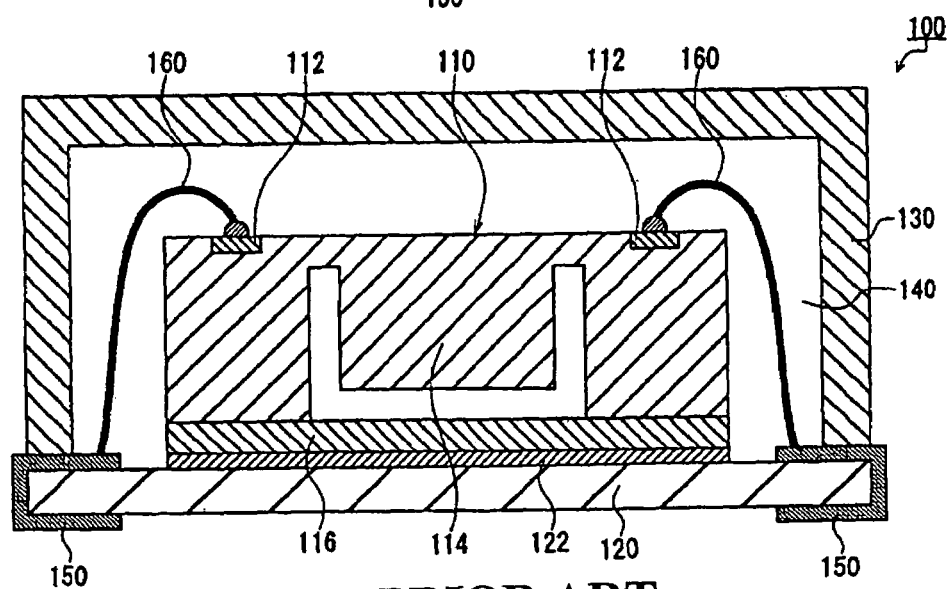
FIG. 17(B) is a sectional view taken along a projected line 17(B)-17(B) in FIG. 17(A)

FIGS. 15(A) and 15(B) are schematic sectional views showing the mounted structure taken along the projected lines in the plan views of the acceleration sensor chip package 10. FIGS. 16(A) and 16(B) are schematic side views showing the mounted structure 90 of the acceleration sensor chip package. As shown in FIG. 15(A), in the mounted structure 90, the acceleration sensor chip package 10 is mounted on the mounting substrate 30.

The mounting substrate 30 is provided with the mounting substrate electrode pads 32 exposed from the surface thereof. The mounting substrate electrode pads 32 may be coated with solder paste or provided with bumps (not shown) as a connecting structure in advance. The mounting substrate electrode pads 32 are connected to the outer terminals 70 protruding from the acceleration sensor chip package 10 or the acceleration sensor chip 11. In the embodiment, the outer terminals 70 are connected to the mounting substrate electrode pads 32 through fillets 72 with a re-flow process, while the exposed surfaces 70b are covered. With the structure including the fillets 72, it is possible to strongly connect the outer terminals 70 to the mounting substrate electrode pads 32.

The mounted structure 90 includes the second sealing portion 34 for sealing parts of the first sealing portions 20 covering the outer terminals 70 on a side of the mounting substrate 30, the outer terminals 70, especially the whole area of the exposed surfaces 70b, and the mounting substrate electrode pads 32.

As shown in FIG. 16(A), the second sealing portion 34 may be formed in a continuous closed ring shape for sealing all of the outer terminals 70. When the second sealing portion 34 has a continuous closed ring shape, the movable structure 15 is sealed in a closed space defined by the mounting substrate 30, the first and second sealing portions 20 and 34, and the substrate 12. When the first sealing portion 20 is formed of the first partial sealing portions 20a arranged in a comb pattern, the second sealing portion 34 may be provided with gaps between the first partial sealing portions 20a.

Alternatively, as shown in FIG. 16(B), the second sealing portion 34 may be formed of a plurality of second partial sealing portions 34a each for sealing a set of one outer terminal 70 and one mounting substrate electrode pad 32 connected thereto. When the first sealing portion 20 has a continuous closed ring shape, gaps may be formed between the first sealing portion 20 and the second partial sealing portions 34a connected thereto. When the first sealing portion 20 is formed of the first partial sealing portions 20a, gaps may be formed between the first partial sealing portions 20a.

A process of mounting the acceleration sensor chip package 10 of the second embodiment on the mounting substrate 30 will be explained next with reference to FIGS. 15(A), 15(B), 16(A), and 16(B). First, the acceleration sensor chip package 10 and the mounting substrate 30 with a plurality of the mounting substrate electrode pads 32 are prepared. Then, the outer terminals 70 are connected to the mounting substrate electrode pads 32 followed by the sealing process through one of the following two methods.

In the first method, as shown in FIG. 15(A), the tope surfaces 70a of the outer terminals 70 face the mounting substrate electrode pads 32 one to one, and the acceleration sensor chip package 10 is placed on the mounting substrate 30. In the embodiment, the mounting substrate electrode pads 32 are coated with solder paste (not shown) in advance.

In the next step, the re-flow process is performed using a known re-flow bath with a known method, so that the outer terminals 70 are melted and attached to the mounting substrate electrode pads 32 with solder paste. At this time, the solder paste flows up along the exposed surfaces 70b to form the fillets 72. Then, a resin material is supplied using a known dispenser with a dispenser method to form the second sealing portion 34. The second sealing portion 34 covers a part of the first sealing portion 20 of the acceleration sensor chip package 10, the outer terminals 70, especially the whole area of the exposed surfaces 70b, and the mounting substrate electrode pads 32 connected to the outer terminals 70.

In the step of supplying the resin material, the resin material is supplied in a closed ring shape as shown in FIG. 16(A) to form the second sealing portion 30. Alternatively, as shown in FIG. 16(B), the resin material may be supplied to each of the outer terminals 70. When the resin material is supplied, the resin material may flow to the mounting surface of the mounting substrate 30 below the outer terminals 70, the frame portion 13 inside the mounting substrate electrode pads 32, or the movable structure 15. In this case, as far as the movable structure 15 is not interfered, the resin material does not cause a problem.

Lastly, the resin material is cured under an appropriate condition to form the second sealing portion 34. Accordingly, through the steps described above, the mounted structure 90 including the acceleration sensor chip package 10 is completed.

In the second method, the acceleration sensor chip package 10 is mounted with a press-contact process. First, like the first method, the mounting substrate 30 is prepared. As shown in FIG. 15(B), the bumps 36 are formed on the mounting substrate electrode pads 32. Then, a resin material is supplied in a closed ring shape or to each of the mounting substrate electrode pads 32 and the bumps 36 to form the second sealing portion 34, as shown in FIG. 16(A) or 16(B).

In the next step, the outer terminals 70 are pressed against the mounting substrate electrode pads 32 one to one through the bumps 36 with a known process. At this time, the outer terminals 70 are covered with the resin material. Then, the resin material is cured to form the second sealing portion 34 (second partial sealing portions 34a), thereby fixing the outer terminals 70 to the mounting substrate electrode pads 32. In the embodiment, the bumps 36 are disposed on the mounting substrate electrode pads 32, and may be disposed on the outer terminals 70 in advance. Through the steps described above, the mounted structure 90 including the acceleration sensor chip package 10 is completed as shown in FIG. 15(B).

While the invention has been explained with reference to the specific embodiments of the invention, the explanation is illustrative and the invention is limited only by the appended claims.

What is claimed is:

1. An acceleration sensor chip package, comprising:
   an acceleration sensor chip including a frame portion having an upper surface and a lower surface opposite to the upper surface, an opening portion formed in the frame portion and extending from the upper surface to the lower surface, a movable structure having a beam portion extending from the frame portion toward inside the opening portion and a movable portion disposed in the opening portion and supported on the beam portion to be movable, a detection element for detecting a movement of the movable structure, and an electrode pad electrically connected to the detection element and exposed from the upper surface;
   an outer terminal disposed on the upper surface and electrically connected to the electrode pad;
   a substrate attached to the lower surface for sealing the opening portion from a side of the lower surface; and
   a first sealing portion disposed on the upper surface for sealing the electrode pad and the outer terminal such that a part of the outer terminal and an entire portion of the movable portion are exposed.

2. The acceleration sensor chip package according to claim 1, wherein said outer terminal is arranged to protrude from the upper surface.

3. The acceleration sensor chip package according to claim 1, further comprising a re-wiring layer including a wiring portion extending on the frame portion and having two ends, one of said two ends of the wiring portion being electrically connected to the electrode pad.

4. The acceleration sensor chip package according to claim 1, wherein said acceleration sensor chip includes a plurality of electrode pads; said re-wiring layer includes a plurality of wiring portions; said outer terminal includes a plurality of outer terminal portions; and said first sealing portion includes a plurality of first partial sealing portions, each of the first partial sealing portions sealing a set of at least one of the plurality of the electrode pads, at least one of the plurality of the wiring portions, and at least one of the plurality of the outer terminal portions.

5. The acceleration sensor chip package according to claim 1, wherein said outer terminal has a column shape and includes a top surface and a side surface, at least one of said top surface and said side surface being partially exposed from the first sealing portion.

6. The acceleration sensor chip package according to claim 1, wherein said outer terminal includes an electrode post electrically connected to the other end of the wiring portion and having a top surface exposed from the first sealing portion, and a solder ball disposed on and electrically connected to the top surface of the electrode post.

7. The acceleration sensor chip package according to claim 1, wherein said first sealing portion has a closed shape.

8. A mounted structure comprising the acceleration sensor chip package according to claim 1, a mounting substrate having a mounted substrate electrode pad connected to the outer terminal, and a second sealing portion for sealing a part of the first sealing portion and the outer terminal.

9. The mounted structure according to claim 8, wherein said acceleration sensor chip includes a plurality of electrode pads; said rewiring layer includes a plurality of wiring portions; said outer terminal includes a plurality of outer terminal portions; and said first sealing portion includes a plurality of first partial sealing portions, each of the first partial sealing portions sealing a set of at least one of the plurality of the electrode pads, at least one of the plurality of the wiring portions, and at least one of the plurality of the outer terminal portions.

10. The mounted structure according to claim 9, wherein said second sealing portion has a closed shape for sealing at least one of the plurality of the electrode pads and at least one of the plurality of the outer terminal portions.

11. The mounted structure according to claim 9, wherein said second sealing portion includes a plurality of second partial sealing portions, each of said second partial sealing portions sealing a set of at least one of the plurality of the electrode pads and at least one of the plurality of the outer terminal portions.

12. The mounted structure according to claim 8, wherein said outer terminal has a column shape and includes a top surface and a side surface, at least one of said top surface and said side surface having an exposed surface partially exposed from the first sealing portion, said second sealing portion sealing the exposed surface.

13. The acceleration sensor chip package according to claim 1, further comprising a mounting substrate attached to the outer terminal for restricting an upper movement of the movable portion.

14. The acceleration sensor chip package according to claim 1, further comprising a mounting substrate attached to the outer terminal having a sufficient height so that the movable portion can move upwardly.

15. The acceleration sensor chip package according to claim 1, wherein said first sealing portion is formed through curing a liquid resin.

16. A method of producing a mounted structure, comprising the steps of: preparing the acceleration sensor chip package according to claim 1; preparing a mounting substrate having a mounting substrate electrode pad; connecting the outer terminal to the mounting substrate electrode pad; and forming a second sealing portion for sealing a part of the first sealing portion, the outer terminal, and the mounting substrate electrode pad.

17. The method of producing a mounted structure according to claim 16, wherein said step of forming the second sealing portion comprises the steps of: supplying a liquid resin in a closed shape and curing the liquid resin.

18. The method of producing a mounted structure according to claim 16, wherein, in the step of forming the second sealing portion, said second sealing portion includes a plurality of second partial sealing portions each sealing a set of the outer terminal and the mounting substrate electrode pad.

19. The method of producing a mounted structure according to claim 16, wherein said outer terminal has a column shape and includes a top surface and a side surface, at least one of said top surface and said side surface having an exposed surface partially exposed from the first sealing portion, said second sealing portion sealing the exposed surface.

* * * * *